United States Patent
Xue et al.

(10) Patent No.: US 9,534,289 B2
(45) Date of Patent: Jan. 3, 2017

(54) PLASMA PROCESS CHAMBERS EMPLOYING DISTRIBUTION GRIDS HAVING FOCUSING SURFACES THEREON ENABLING ANGLED FLUXES TO REACH A SUBSTRATE, AND RELATED METHODS

(71) Applicant: Applied Materials, Inc., Santa Clara, CA (US)

(72) Inventors: Jun Xue, San Jose, CA (US); Ludovic Godet, Sunnyvale, CA (US); Qiwei Liang, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/657,405

(22) Filed: Mar. 13, 2015

(65) Prior Publication Data

US 2015/0368801 A1    Dec. 24, 2015

Related U.S. Application Data

(60) Provisional application No. 62/013,990, filed on Jun. 18, 2014.

(51) Int. Cl.
 C23F 1/00       (2006.01)
 C23C 16/04      (2006.01)
 H01J 37/32      (2006.01)

(52) U.S. Cl.
 CPC ....... *C23C 16/045* (2013.01); *H01J 37/32357* (2013.01); *H01J 37/32422* (2013.01); *H01J 37/32449* (2013.01); *H01J 37/32633* (2013.01)

(58) Field of Classification Search
 CPC .............. H01J 37/32651; H01J 37/32697; H01J 37/32642; H01J 37/32633; H01J 37/32623; H01J 21/311; H01J 21/02513

USPC ............. 156/345.19, 345.3, 345.34, 345.47; 438/709, 710, 717, 731
 See application file for complete search history.

(56) References Cited

U.S. PATENT DOCUMENTS

| | | | |
|---|---|---|---|
| 7,446,325 B2 * | 11/2008 | Hwang | H01J 37/32422 250/251 |
| 2002/0023831 A1 * | 2/2002 | Iwase | C23C 14/228 204/192.12 |
| 2002/0185229 A1 * | 12/2002 | Brcka | H01J 37/3244 156/345.48 |
| 2004/0137745 A1 * | 7/2004 | Houghton | H01L 21/02087 438/706 |

(Continued)

*Primary Examiner* — Lan Vinh
(74) *Attorney, Agent, or Firm* — Patterson & Sheridan, LLP

(57) ABSTRACT

Plasma process chambers employing distribution grids having focusing surfaces thereon enabling angled fluxes to reach a substrate, and associated methods are disclosed. A distribution grid is disposed in a chamber between the plasma and a substrate. The distribution grid includes a first surface facing the substrate and a focusing surface facing the plasma. A passageway extends through the distribution grid, and is sized with a width to prevent the plasma sheath from entering therein. By positioning the focusing surface at an angle other than parallel to the substrate, an ion flux from the plasma may be accelerated across the plasma sheath and particles of the flux pass through the passageway to be incident upon the substrate. In this manner, the angled ion flux may perform thin film deposition and etch processes on sidewalls of features extending orthogonally from or into the substrate, as well as angled implant and surface modification.

20 Claims, 15 Drawing Sheets

(56) References Cited

U.S. PATENT DOCUMENTS

| | | | |
|---|---|---|---|
| 2005/0181617 A1* | 8/2005 | Bosch | C04B 41/0054 438/710 |
| 2006/0163466 A1* | 7/2006 | Park | H01J 37/026 250/251 |
| 2006/0284563 A1* | 12/2006 | Yoo | H01J 37/321 315/111.61 |
| 2007/0158305 A1* | 7/2007 | Cooke | H01J 37/32633 216/67 |
| 2012/0104274 A1* | 5/2012 | Hirayanagi | B82Y 10/00 250/424 |

* cited by examiner

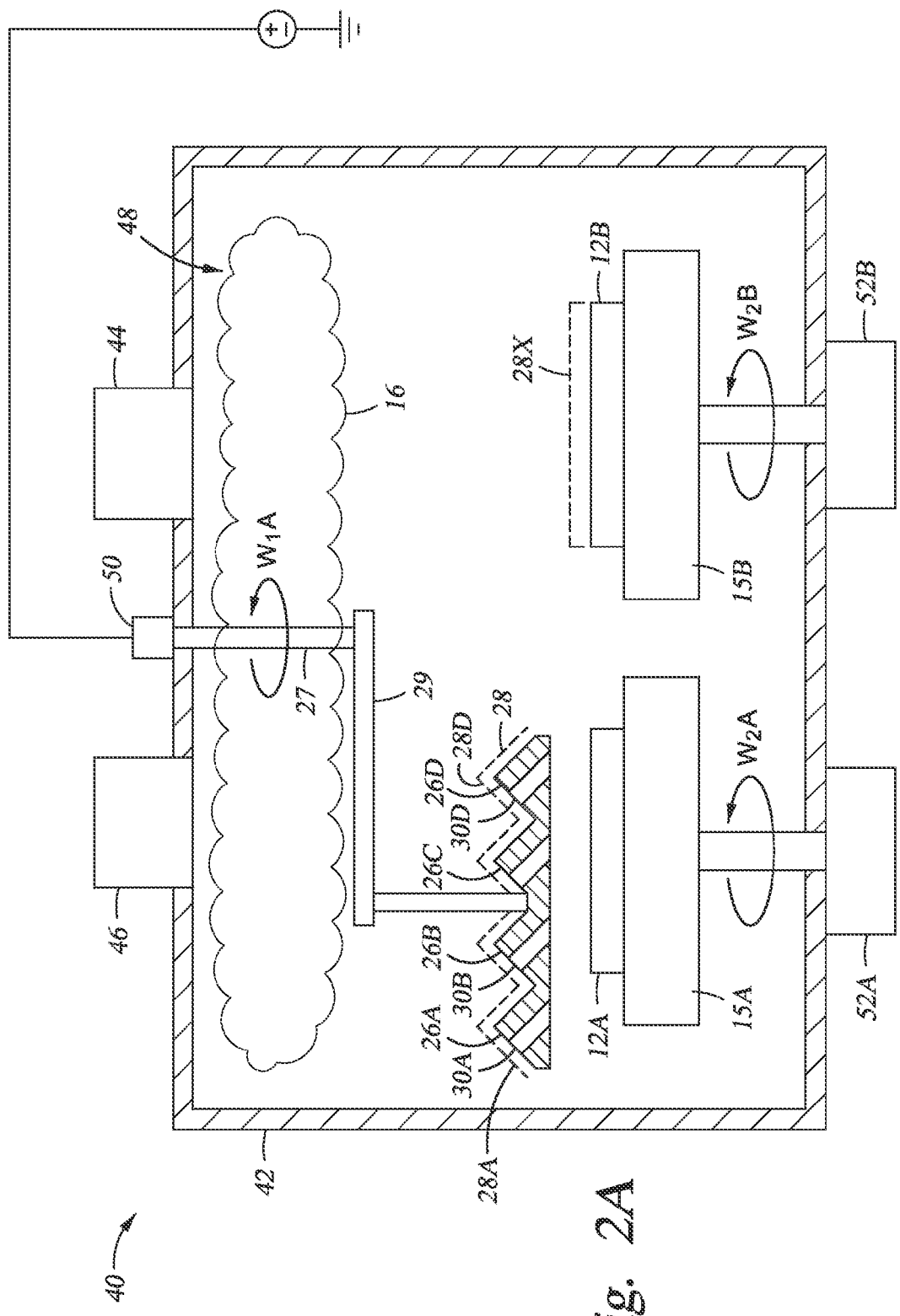

PLASMA PROCESS CHAMBERS EMPLOYING DISTRIBUTION GRIDS HAVING FOCUSING SURFACES THEREON ENABLING ANGLED FLUXES TO REACH A SUBSTRATE, AND RELATED METHODS

CROSS-REFERENCE TO RELATED APPLICATION

This application claims the benefit of U.S. Provisional Application Ser. No. 62/013,990 entitled "Plasma Process Chambers Employing Distribution Grids Having Focusing Surfaces Thereon Enabling Angled Fluxes To Reach A Substrate, and Related Methods," and filed Jun. 18, 2014, which is incorporated herein by reference in its entirety.

BACKGROUND

Field

Embodiments of the present disclosure generally relate to apparatuses and methods for plasma processing of substrates for the deposition and etching of film layers thereon, and for implantation or surface modification thereof using a plasma material flux.

Description of the Related Art

A plasma processing device generates plasma in a process chamber, which plasma is useful for performing various operations upon a workpiece disposed within the process chamber. The different operations may include etching, deposition, and/or ion implantation and surface modification processes. These processes may contribute to the fabrication of three-dimensional structures on the workpiece which may form, for example, discrete devices and/or the electrical interconnection circuitry for a device. Examples of three-dimensional structures which may be formed using these plasma processes include trench capacitors and vertical channel transistors, such as FinFETs.

As performance requirements and feature size shrink for semiconductor devices become more challenging, the types of three dimensional structures used in fabricating integrated circuits have generally become more complex and the dimensions of these structures have decreased. When using a plasma to etch, ion implant, and/or perform deposition processes, an ion flux from the plasma is accelerated toward the workpiece on which the semiconductor device is being formed. In conventional plasma processing where the ions are accelerated to the workpiece via a sheath existing between the plasma and the workpiece, the workpiece surface exposed to the ion flux is inherently orientated orthogonal or substantially orthogonal to the trajectory of the ion flux. This orthogonal trajectory may be useful to create, by etching, trenches, vias, contacts and isolation structures into the exposed surface of the substrate, or by depositing material into recessed features of the substrate. However, as the aspect ratios of substrate features extending thereinto or therefrom become larger, the profile of the sidewall of the feature may become difficult to control. For example, during reactive ion etching of a deep trench feature, sputter etching of the trench bottom or base is achieved by the directional flux of ions drawn to the substrate surface across the sheath, and hence into the trench, generally perpendicular to the substrate surface. However, the products of sputter etching of the bottom of the feature will often deposit on the sidewall of the feature where the directional ion flux does not easily reach.

Controlling the wall profile of a feature and the re-deposition of sputter etched materials thereon can be accomplished by changing the angular trajectory of the ion flux with respect to the workpiece, and thus sputter etch the redeposited material away and/or directly sputter etch the sidewall with energetic ions. However, the angular trajectory of the ion flux has been difficult to control with precision as conventional methods to control the angular trajectory have been difficult to implement. New approaches are needed to control the trajectory of the ion flux.

SUMMARY

Embodiments disclosed herein include plasma process chambers employing distribution grids having focusing surfaces thereon, which enable ions of the plasma, to reach a substrate surface and the features therein at angles other than perpendicular to the substrate surface, and associated methods. A distribution grid is disposed in a chamber between the plasma and a substrate. The distribution grid includes a first surface facing the substrate and a focusing surface facing the plasma. One or more passageways extend through the distribution grid from the focusing surface to the first surface, wherein the passageways are sized to prevent a plasma sheath formed at the focusing surface from entering into the passageways. By positioning the focusing surface at an angle other than parallel to the substrate, an ion flux from the plasma may be accelerated across the plasma sheath in a direction perpendicular to the focusing surface and thence particles of the ion flux may pass through the passageway to be incident upon the substrate. In this manner, the ion flux may be used to perform thin film deposition and etch processes on sidewalls of features extending orthogonally from or into the substrate, as well as angled implant and surface modification steps.

In one embodiment, a process chamber is disclosed. The process chamber includes an enclosure having a process volume for forming a plasma therein. The process chamber also includes a substrate support disposed within the enclosure for positioning a front surface of a substrate with respect to the plasma. The process chamber also includes a distribution grid disposed between the process volume and the substrate support. The distribution grid includes a first surface facing the substrate support and a focusing surface opposite the first surface. The focusing surface is angled, relative to a plane of the substrate and substrate support, at an angle other than parallel thereto. The distribution grid also includes an inner surface connecting the focusing surface with the first surface. The inner surface forms a passageway having a center axis which is disposed at an angle other than perpendicular to the plane of the substrate. In this manner, sidewalls of features extending from, or into, the surface of the substrate may be subjected to a flux of energetic ions, or radicals or neutrals derived from the ions drawn to the distribution grid.

In another embodiment, a method is disclosed. The method includes disposing a substrate, process volume, and distribution grid within an enclosure. The method also includes positioning the distribution grid having an electrically-conductive body between the process volume and the substrate. The distribution grid includes a first surface facing the substrate and a focusing surface facing the process volume. The focusing surface is angled, relative to a front surface of the substrate, at an angle non-parallel therewith. The method also includes forming a plasma in the process volume, including forming a plasma sheath extending a thickness from the focusing surface of the distribution grid. The method also includes directing a flux of ions in a direction perpendicular to the focusing surface such that a portion of the ions is accelerated across the plasma sheath and particles of the plasma sheath will enter and pass through a passageway of the distribution grid in the direction of the substrate. In this manner, thin films may be directly deposited, etched, implanted or modified with respect to feature surfaces of the substrate which are parallel to a thickness direction of the substrate.

In yet another embodiment, a distribution grid for a process chamber is disclosed. The distribution grid includes an electrically-conductive body including a first surface and a focusing surface opposite the first surface. The first surface is configured to face a front surface of a substrate. The focusing surface is angled relative to the first surface, i.e., is non-parallel therewith. The distribution grid also includes an inner surface connecting the focusing surface with the first surface, which forms a passageway having a center axis disposed at an angle other than perpendicular to the first surface. In this manner, energetic ions, radicals or neutrals may be drawn through the distribution grid and directed at the substrate at an angle of other than perpendicular to the surface of the substrate to modify the front surface of the substrate, such as by etching or depositing a film layer using the ions, or radicals or neutrals derived from the ions, or to otherwise modify a substrate surface or implant ions thereinto.

Additional features and advantages will be set forth in the detailed description which follows, and in part will be readily apparent to those skilled in the art from that description or recognized by practicing the embodiments as described herein, including the detailed description that follows, the claims, as well as the appended drawings.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

So that the manner in which the above recited features of embodiments of the present disclosure can be understood in detail, a more particular description of embodiments of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for embodiments of the disclosure may admit to other equally effective embodiments.

FIG. 2A is a schematic view of an embodiment of the distribution grid of FIG. 1 as part of an exemplary process chamber providing relative movement between at least one substrate and the distribution grid;

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Whenever possible, like reference numbers will be used to refer to like components or parts.

Embodiments disclosed herein include plasma process chambers employing distribution grids having focusing surfaces enabling directional ion fluxes directed at the surface of a substrate at an angle other than perpendicular to the substrate surface, and associated methods. In the embodiments, the distribution grid is disposed in a plasma chamber in a location intermediate of the plasma and a substrate located in the chamber. The distribution grid includes a first surface facing the substrate and a focusing surface facing the plasma and the distribution grid is electrically biased to draw ions from the plasma thereto, through a plasma sheath formed on the focusing surface. A passageway extends through the distribution grid from the focusing surface to the first surface, wherein the passageway is sized sufficiently small in cross section, such that the plasma sheath formed on the focusing surface does not extend thereinto. The passageway extends from the focusing surface generally perpendicular thereto, and the focusing surface is positioned non-parallel to the surface of the substrate facing the first surface. By so configuring the focusing surface and passageway relative to the surface of the substrate, a flux of plasma ions may be accelerated perpendicular to the focusing surface and across the plasma sheath formed thereat, and thence particles of the ion flux may pass through the passageway. The particles of the ion flux entering the passageway pass through the passageway and thence pass to the substrate, at an impact direction other than perpendicular to the surface of the substrate facing the first surface. In this manner, the particles of the angled ion flux may be used to perform thin film processes on sidewalls of features extending from or into the substrate. Given this, it is noted that an increasing portion of the ions of the ion flux entering the passageway may change composition and no longer be ionic, for example through ionic bonding with other matter, combination with electrons, or between ions in the ion flux. In recognition that the "ion flux" may change composition during its trajectory through the passageway of the distribution grid and to the substrate, the terminology of "particles of the ion flux" is used herein for clarity. Accordingly, as particles making up the "ion flux" may change composition, at least some of the particles departing the passageway are identified as being part of the ion flux entering the passageway.

Figure 1:
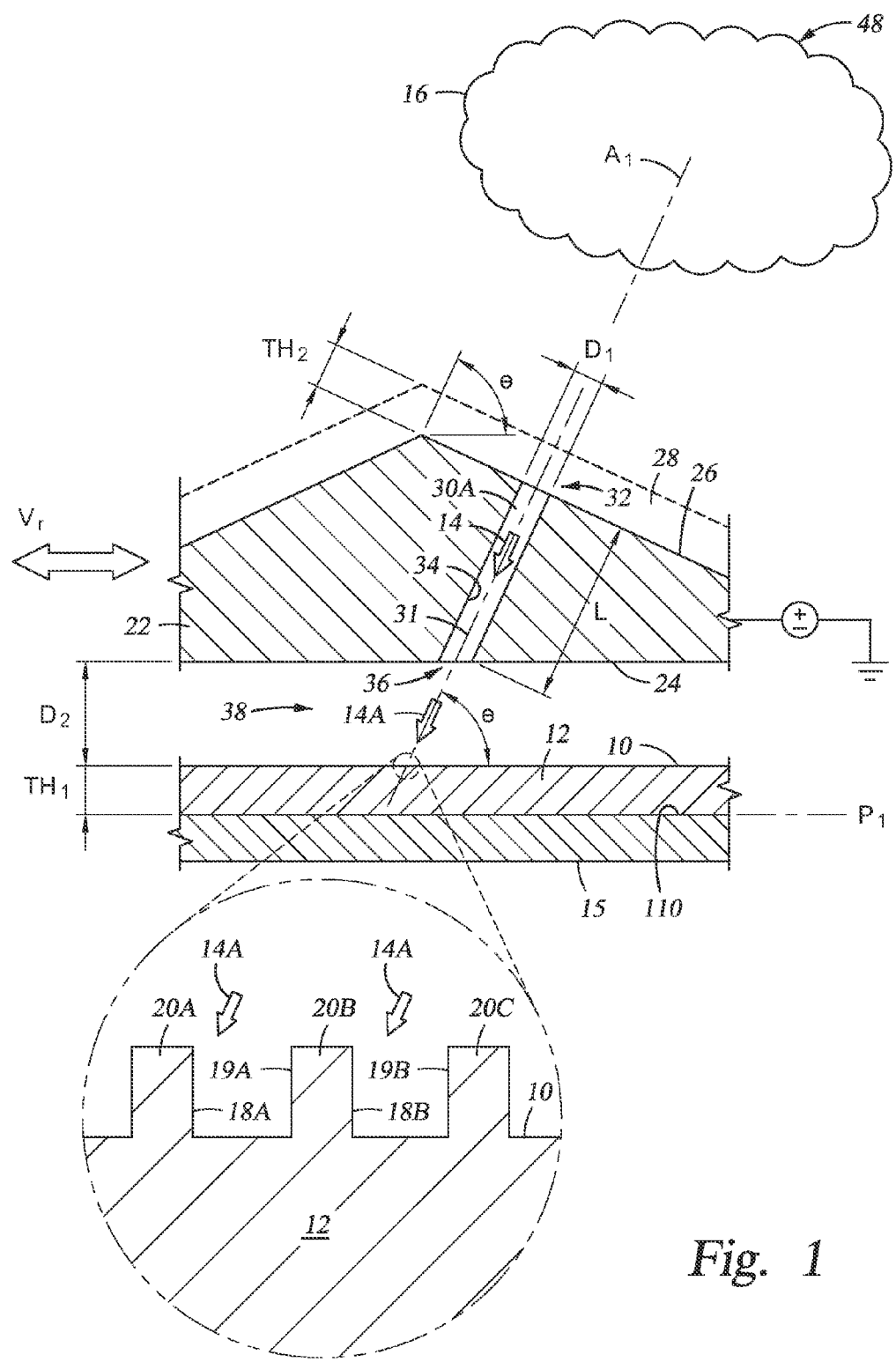
FIG. 1 is a sectional side schematic view of a front surface of an exemplary substrate receiving particles of an angled ion flux accelerated by a plasma sheath formed at a focusing surface of an exemplary distribution grid through a passageway of the distribution grid.

In this regard, FIG. 1 is a sectional side schematic view of a front surface 10 of an exemplary substrate 12 receiving particles 14A of an ion flux 14 at an angle theta ($\theta$) relative to the front surface 10 of the substrate 12. The substrate 12 may be a silicon wafer having a diameter of 300 millimeters, a thickness (TH1) of about 725 microns, and be supported by a substrate receiving surface 110 of a substrate support 15 which may be disposed opposite the front surface 10 of the substrate 12. The ion flux 14 includes ions from the plasma 16 generated as part of, for example, a deposition, an etching, and/or a material modification or ion implant process. The particles 14A of the ion flux 14 will be received at the features of the substrate 12, including the sidewalls 18A, 18B of features 20A, 20B which extend from the front surface 10 of the substrate 12, at an angle other than perpendicular or substantially parallel thereto. It is noted that the features 20A, 20B may be part of a semiconductor or nanotechnology device. In this manner, the sidewalls 18A, 18B may be more precisely processed to have the characteristics required, for example, through deposition, etching, and ion implantation thereof.

The particles 14A of the ion flux 14 received at the substrate surface at the angle theta, i.e., at an angle other than generally perpendicular to the front surface 10 of the substrate 12, are directed to the front surface 10 of the substrate 12 by the distribution grid 22. To achieve this result, the distribution grid 22 is disposed between the plasma 16 and the substrate 12. In this regard, the distribution grid 22 includes a first surface 24 facing the substrate 12, and a focusing surface 26 facing the plasma 16, wherein the focusing surface 26 is not parallel to the first surface 24. Additionally, at least the focusing surface 26 is maintained at a negative bias with respect to the plasma 16. As a result, a plasma sheath 28 is formed at the focusing surface 26, and the plasma sheath 28 extends a thickness TH2 from the focusing surface 26. The thickness TH2 may be in a range, for example, from one (1) millimeter to nine (9) millimeters, the thickness TH2 of which is based upon a number of factors, including the bias on the focusing surface 26 and the chamber and/or the plasma 16 pressure. Positive ions of the plasma 16 are resultantly accelerated along a direction $A_1$ normal to the focusing surface 26 when encountering the plasma sheath 28 extending from the focusing surface 26. The distribution grid 22 includes at least one passageway 30A which is sized with a width D1 to prevent the plasma sheath 28 from entering the passageway 30A. In one case, the width D1 may be in a range from five-hundred (500) microns to five (5) millimeters and be equal to or less than the thickness TH2 of the plasma sheath 28. Because the ions from the plasma 16 are accelerated along the direction $A_1$ normal to the focusing surface 26, the portion of these positively charged ions not impacting the focusing surface 26 may enter an entry opening 32 of the passageway 30A at the focusing surface 26. The passageway 30A is formed by an inner surface 34 of the distribution grid 22 which extends from the focusing surface 26 to the first surface 24 to form the passageway wall, such that the passageway 30A has a central axis 31 extending generally normal (perpendicular) to the focusing surface 26 and parallel to direction $A_1$, and the central axis 31 is thus generally parallel to the direction by which the ions flux 14 is drawn across the plasma sheath 28. Accordingly, once accelerated across the plasma sheath 28 and then into the passageway 30A, the particles 14A of the ion flux 14 can travel the length L of the passageway 30A and depart the passageway 30A at the exit opening 36 of the passageway 30A located at the first surface 24. The particles 14A of the ion flux 14 departing the passageway 30A continue ballistically in the direction $A_1$ until received at the substrate 12. In this manner, the sidewalls 18A, 18B of the features 20A, 20B are exposed to the particles 14A of the ion flux 14 at an angle other than generally parallel thereto. The ions may convert, during or after passing through the passageway, to radicals or neutrals, but the kinetic energy thereof created by acceleration of the ion across the plasma sheath 28 remains in the moving neutral or radical. As a result, where the particles 14A of the ion flux 14 are an etchant, the sidewalls 18A, 18B, or re-deposited material thereon, may be etched away. Where the particles 14A of the ion flux 14 are, for example, a deposition material flux, the particles 14A of the ion flux 14 will deposit on the sidewalls 18A, B. Where the particles 14A of the ion flux 14 are for example a material modification or implanting flux, the ions can penetrate inwardly of the sidewall surfaces to change a property of the sidewall of the surface material. For example, a flux of carbon ions drawn from a methane plasma impacting a silicon feature sidewall 18A, 18B, will result in the forming of a silicon carbide layer extending inwardly of the sidewall 18A, 18B. Where the particles 14A of the ion flux 14 are an etchant flux, sidewalls of the feature at which the flux is directed can be reactive ion etched or sputter etched, and re-deposited etch products may be removed therefrom. Where the particles 14A of the ion flux 14 are a deposition flux, the deposition material is directed at a sidewall, and will preferentially stick thereto to build up a film layer thereon. In each case, the substrate 12 need not be biased, as the directionality of the flux 14 is provided by the grid 22, and by the angling of a plasma sheath 28 on the focusing surface 26 in a direction non-parallel to the front surface 10 of the substrate 12 or in a direction non-parallel to a plane P1 of a substrate receiving surface 110 of the substrate support 15. Thus, a flux of deposition, etch, implant or modification species is directed at the substrate, and the kinetic energy of the flux is decoupled from the bias of the substrate.

With continuing reference to FIG. 1, portions of the front surface 10 of the substrate 12 disposed in the path of the particles 14A of the ion flux 14 departing from the passageway 30A receive the particles 14A of the ion flux 14. Other portions of the front surface 10 which are not in the path of the passageway 30A will not receive the particles 14A of the ion flux 14. To achieve uniform exposure of the front surface 10 of the substrate 12 to the angled flux of the particles 14A, relative movement Vr between the distribution grid 22 and the substrate 12 is provided. In some cases, relative movement may be provided by moving the distribution grid 22 and/or the substrate 12 without changing the angular alignment therebetween. The relative movement may be rotational, linear translation (or scanning), orbital, or combinations thereof, such as planetary motion. It is also noted that translation alone will result in isotropic processing of the front surface 10 of the substrate 12, as all ions in the flux would reach the front surface 10 of the substrate 12 from the same general direction if the passageways 30A in the distribution grid 22 all have the same orientation. Simple rotation of the substrate or the distribution grid 22 may likewise result in isotropic processing of the substrate surface centered around the axis of rotation where the passageways 30A in the distribution grid 22 all have the same orientation, because the particles 14A of the ion flux 14 will travel in the same general direction with respect to the center of rotation of the substrate 12 or grid 22. Movement of both the substrate 12 and the grid 22 in rotational and linear direction can be employed to provide an anisotropic flux reaching the individual substrate features 20A, 20B, etc. Additionally, the grid 22 may include a multifaceted focusing surface, such that different portions of the focusing surface 26 are disposed at different angles, and thus different directions of orientation, with respect to the first surface 24 of the grid 22 are provided. As a result, a plurality of flux angles, relative to the front surface 10 of the substrate, can be achieved.

With continued reference to FIG. 1, the first surface 24 includes the exit opening 36 from which the particles 14A of the ion flux 14 depart the passageway 30A. The first surface 24 may include a shape, in some cases planar, configured to minimize an interstitial gap 38 of a distance D2 between the distribution grid 22 and the substrate 12. Minimizing the distance D2 of the interstitial gap 38 minimizes an opportunity for the particles 14A of the ion flux 14 to vary from the direction $A_1$. In some cases the distance D2 may be in a range from one (1) to twelve (12) millimeters. In this manner, the angle at which the particles 14A of the ion flux 14 are received by the substrate 12 can be more precisely controlled.

It is noted that the substrate 12 is not biased when the particles 14A of the ion flux 14 depart from the passageway 30A and are received along the direction $A_1$ which is orthogonal to the focusing surface 26. A voltage bias at the substrate 12 could cause a second plasma sheath to form and be disposed at the front surface 10 of the substrate 12. This second plasma sheath would cause the particles 14A of the ion flux 14 to change trajectory and be received orthogonal to the front surface 10 of the substrate 12 defeating the efforts of the focusing surface 26 to angle the trajectory of the particles 14A of the ion flux at the direction $A_1$. Accordingly, where the substrate 12 is not biased, the second plasma sheath will not form in the interstitial gap 38 between the distribution grid 22 and the substrate 12 and thereby change the direction of the particles 14A of the ion flux 14. The distribution grid 22, or the focusing surface 26, may be electrically-conducting and may include at least one strong, plasma-resistant material, for example, silicon carbide, nanocrystalline diamond, and/or doped-silicon. In this manner, a processed substrate may be free of contamination from the distribution grid 22 and yet provide the particles 14A of the ion flux 14 at an angled trajectory to the substrate 12.

Now that the distribution grid 22 has been introduced an exemplary embodiment is now discussed. In this regard, FIG. 2A is a schematic view of an embodiment of the distribution grid 22 of FIG. 1 as part of an exemplary process chamber 40 providing relative movement between at least one substrate 12A, 12B and the distribution grid 22. The process chamber 40 includes enclosure walls 42 which enclose the distribution grid 22, substrates 12A, 12B and substrate supports 15A, 15B.

The process chamber 40 includes a gas source 44 and a plasma source 46 configured to form plasma 16 from the ionizable gas provided by the gas source 44. The resulting plasma 16 is disposed in a process volume 48 within the enclosure walls 42. The distribution grid 22 includes focusing surfaces 26A-26D and respective passageways 30A-30D extending through the grid 22 generally perpendicular to the focusing surface 26 from which each extends. The plasma sheath 28 is formed on the focusing surfaces 26A-26D and extends a thickness TH2 from the focusing surfaces 26A-26D. The passageways 30A-30D are, as earlier described herein, sized to prevent the plasma sheath 28 from entering the passageways 30A-30H. As the positive ions of the plasma 16 are accelerated by a negative bias on the focusing surfaces 26A-26D and thus toward the focusing surfaces 26A-26D along the direction $A_1$ normal to the focusing surfaces 26A-26D (FIG. 1), a portion of these ions travel through the passageways 30A-30D and are received at the substrates 12A, 12B as ions, or radicals or neutrals derived therefrom. Actuator 50 swings the distribution grid 22 through a circular orbit at a rotational speed omega1A ($\omega$1A) while the substrate supports 15A, 15B supporting the substrates 12A, 12B respectively may be rotated about their centers by the actuators 52A, 52B at respective rotational speeds omega2A, omega2B ($\omega$2A, $\omega$2B). The actuators 50, 52A, 52B may comprise, for example, electric motors. The rotational speeds $\omega$1A, $\omega$2A, $\omega$2B provide relative movement of the distribution grid 22 to the substrates 12A, 12B. In this manner, more uniform, anisotropic, exposure of the sidewalls 18A, 18B, 19A, 19B (FIG. 1) may be achieved.

Figure 2B:
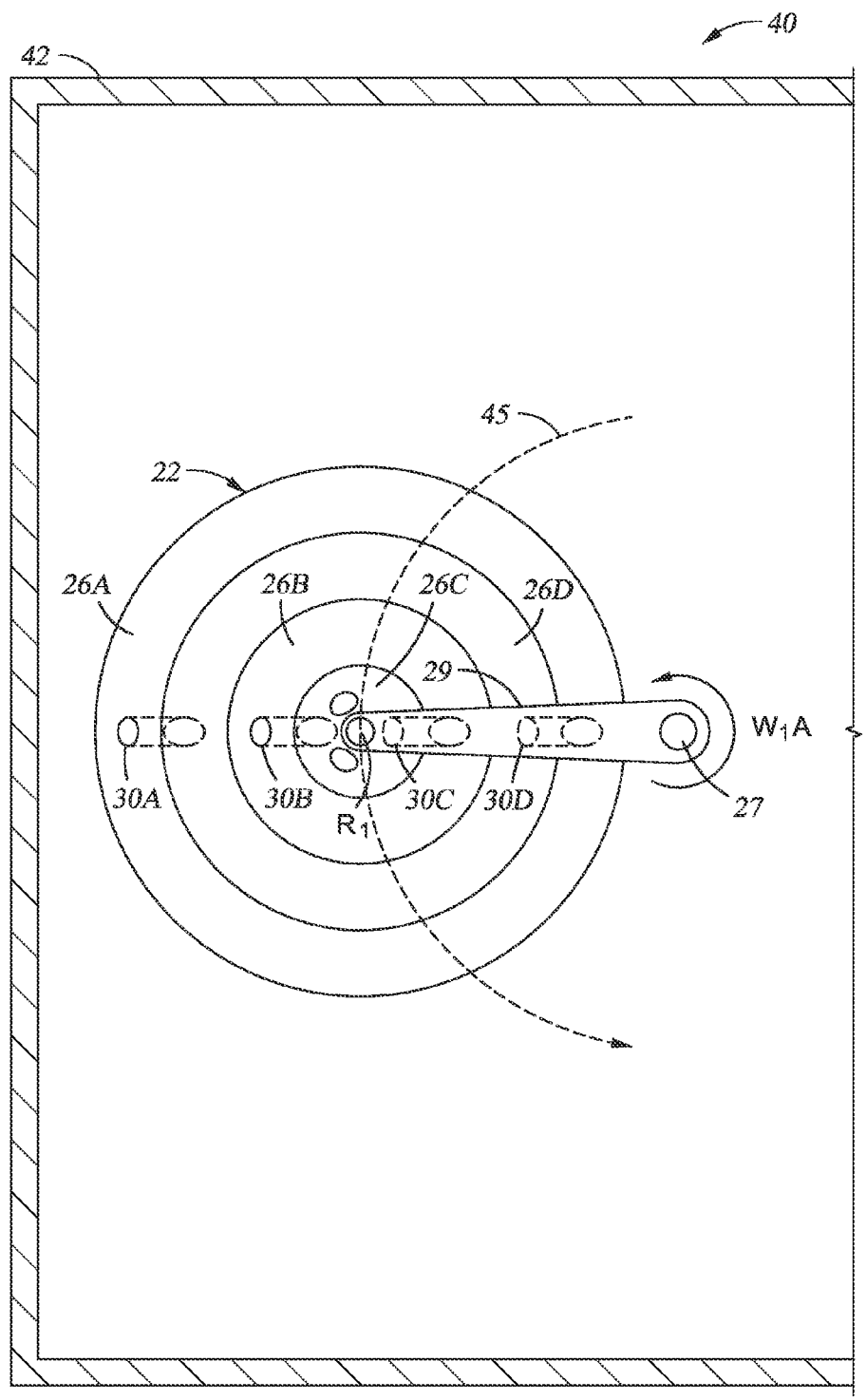
FIG. 2B is a schematic of the distribution grid of FIG. 2A showing exemplary relative movement.
Figure 3A:
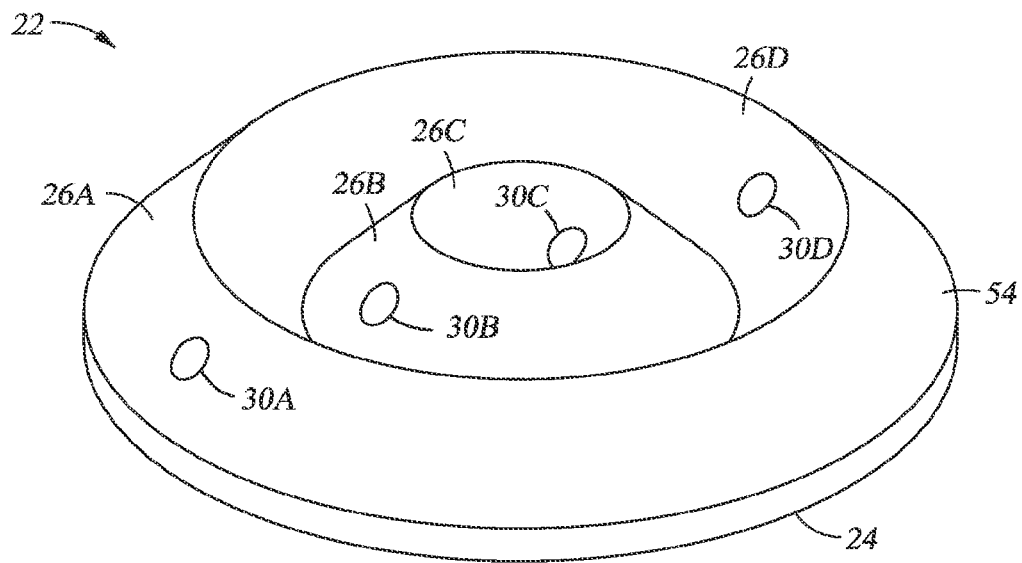
FIGS. 3A through 3D are a top perspective view, a sectional side view, a top view and a bottom view, respectively, of the distribution grid of FIG. 2A.
Figure 3B:
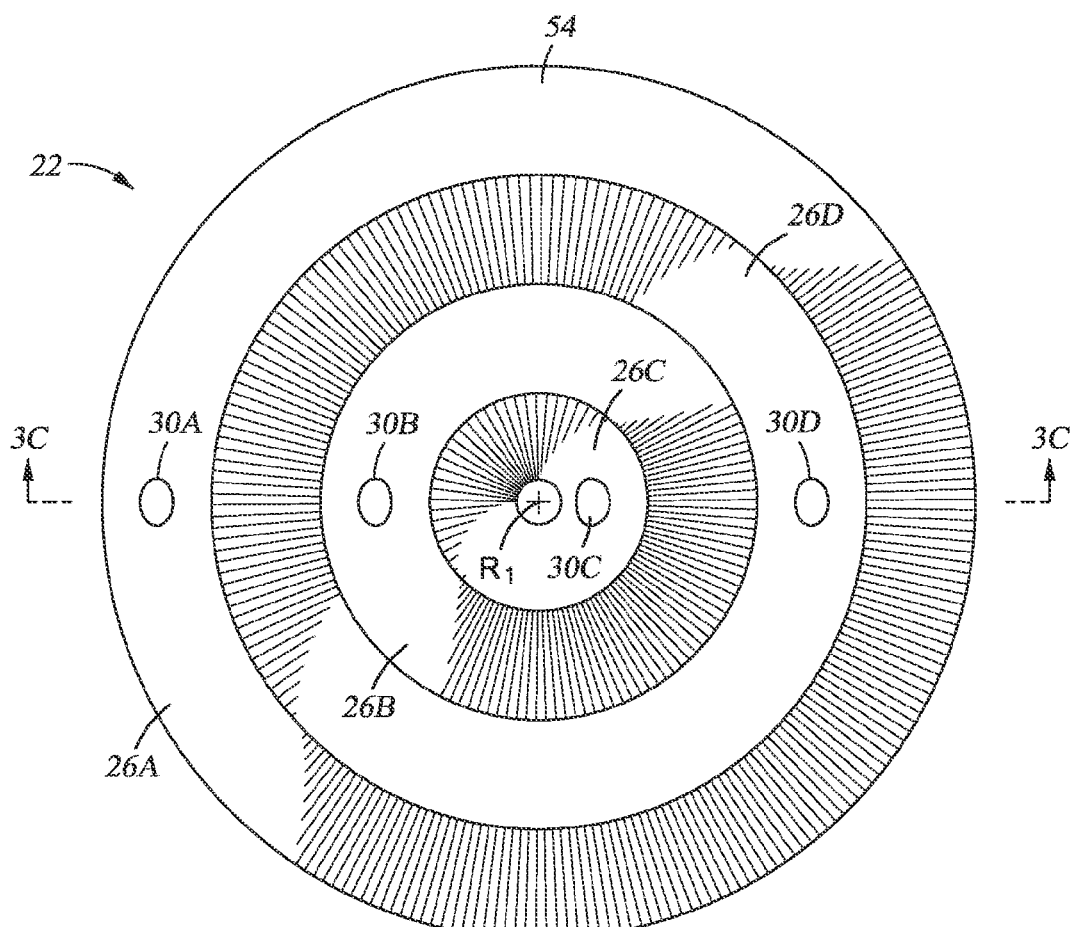
Figure 3C:
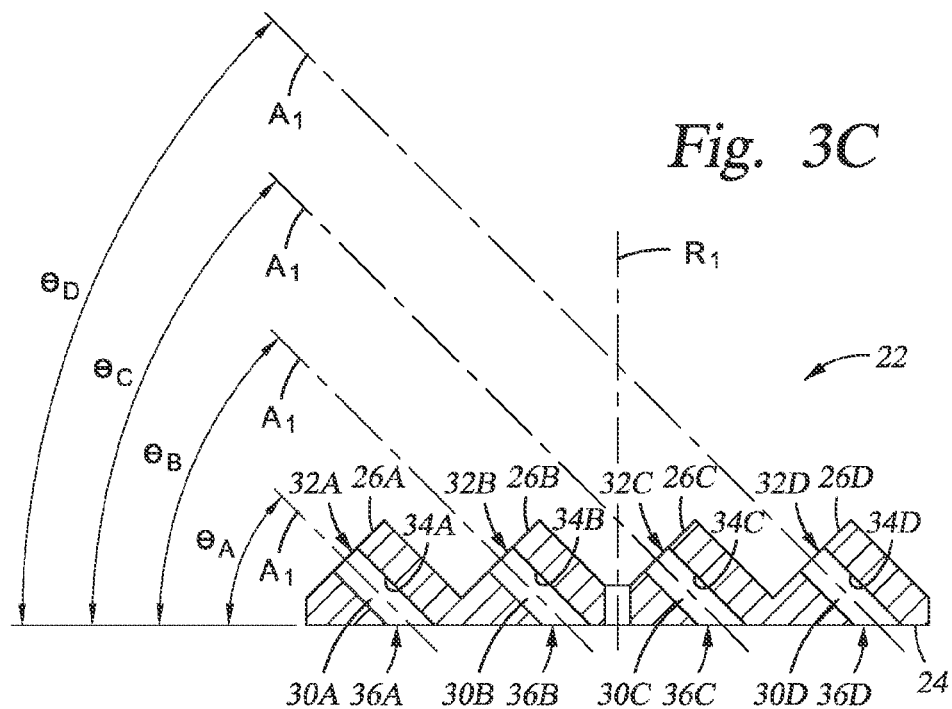
Figure 3D:
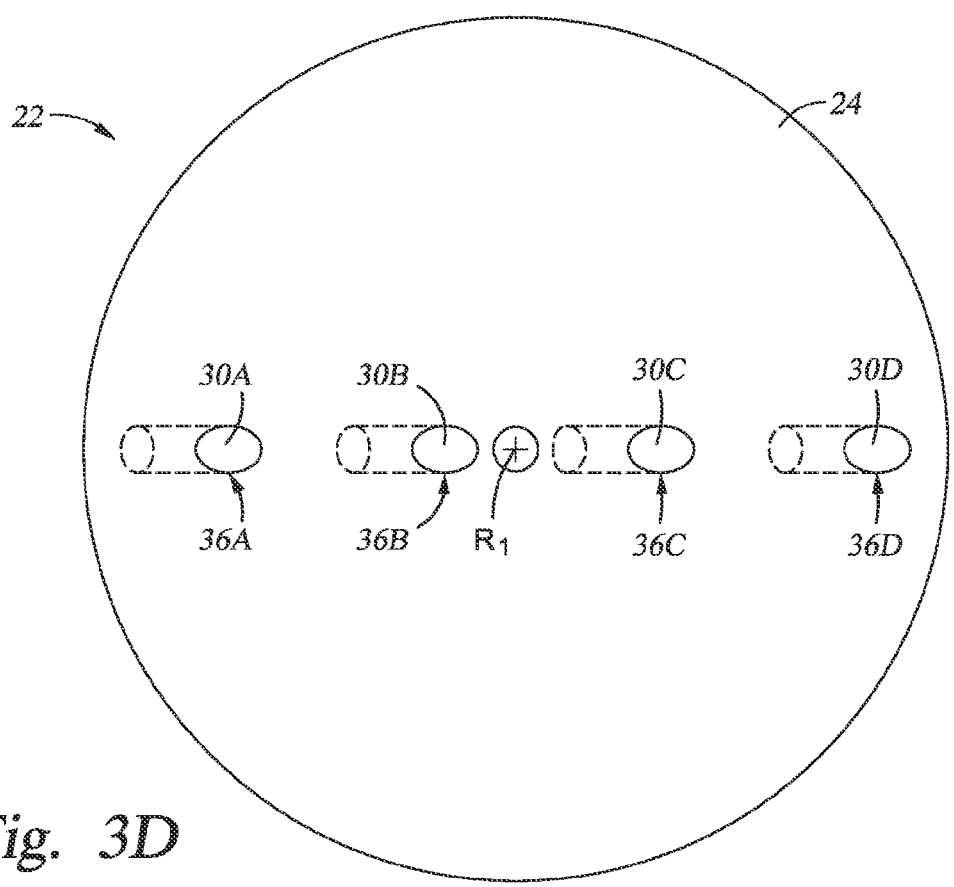

FIG. 2B is a schematic of the distribution grid 22 of FIG. 2A showing exemplary relative movement of the distribution grid 22 as planetary movement. In this case, the distribution grid 22 orbits about a shaft 27 (FIG. 2A) in a circular arc 45 centered about shaft 27 at the rotational speed omega1a ($\omega$1A). A location on the distribution grid 22 forming the axis of rotation R1 of the distribution grid 22 is connected to the shaft 27 via a swing arm 29 enabling the distribution grid 22 to rotate in a planetary motion, i.e., to move in a circular orbit about an axis not centered thereon while simultaneously rotating about an axis R1 located thereon, relative to the location of the substrates 12A, 12B. In this manner, an anisotropic ion flux is directed at the substrate 12 at a plurality of directions all angled from normal to the front surface 10 of the substrate 12.

It is noted that as the distribution grid 22 is, in this embodiment, moved across the substrates 12A, 12B, at times the distribution grid 22 will not be present between the substrate 12 and the plasma 16 in the process volume 48. By selectively negatively biasing the substrates 12A, 12B or the substrate supports 15A, 15B, a second plasma sheath 28X (FIG. 2A) will form between the plasma 16 and the substrates 12A, 12B, or portion of a substrate, not overlaid by the distribution grid 22, and plasma ions will be drawn to the substrate 12 in a direction generally perpendicular to the upper surface thereof. The second plasma sheath 28X may not form on a portion of the substrate which is overlaid by the distribution grid 22 as long as the distance D2 of the interstitial gap 38 (FIG. 1) between the substrates 12A, 12B and the first surface 24 of the distribution grid 22 is smaller than a width of the second plasma sheath 28X formed in the portion of the substrate not overlaid by the distribution grid 22. Hence, in a portion of the substrate not overlaid by the distribution grid 22, a perpendicular direction of the particles 14A of the ion flux 14 is periodically drawn to the front surface 10 of substrates 12A, 12B directly from the plasma 16. In contrast, in a portion of the substrates 12A, 12B overlaid by the distribution grid, the particles 14A of the ion flux 14 drawn through the distribution grid 22, and not directed perpendicular to the front surface 10 of the substrate 12A, 12B, are periodically directed at the front surface of the substrate 12A, 12B. Accordingly, for the features 20A, 20B, 20C of FIG. 1 having high aspect ratios (height/width), a period of time is provided (when overlaid by the distribution grid) when the particles 14A of the ion flux 14 can reach the base of the feature but not materially contact and affect the feature sidewall. Moreover, another time is provided (when overlaid by the distribution grid) when the particles 14A of the ion flux 14 are directed at the sidewalls of the feature and the particles 14A do not reach the feature base. In this manner, an anisotropic treatment of the substrate is achieved by use of the second plasma sheath 28X and control of the feature sidewalls are enabled using the particles 14A of the ion flux 14 drawn through the distribution grid 22.

FIG. 3A through 3D are a top perspective view, a sectional side view, a top view and a bottom view, respectively, of the distribution grid 22 of FIG. 2A. The distribution grid 22 includes the first surface 24 and the focusing surfaces 26A-26D. Normal vectors of respective planes of the focusing surfaces 26A-26D are disposed at an angle theta ($\theta$) relative to the first surface 24. When a bias is placed on the distribution grid 22 and the focusing surfaces 26A-26D are exposed to a plasma 16, then the plasma sheaths 28A-28D (FIG. 2A) may be respectively formed at the focusing surfaces 26A-26D. In this manner, the ion flux 14 is accelerated across the plasma sheaths 28A-28D in a direction orthogonal to the focusing surfaces 26A-26D.

The focusing surfaces 26A-26D include the entry openings 32A-32D to the passageways 30A-30D. The passageways 30A-30D are formed by the inner surfaces 34A-34D respectively connecting the first surface 24 to a corresponding focusing surface 26A-26D. At least a portion of the ion flux 14, which is accelerated towards to the focusing surfaces 26A-26D across the plasma sheaths 28A-28D formed at the respective focusing surfaces 26A-26D, passes into the openings 32A-32D and then through the passageways 30A-30D. In this manner, at least a portion of the ion flux 14 is accelerated through the passageways 30A-30D formed by the inner surfaces 34A-34D extending through the distribution grid 22, and thence to the substrate 12.

It is noted that respective normal vectors of the focusing surfaces 26A-26D may be disposed at angles theta_A through theta_D ($\theta_A$-$\theta_D$) relative to the first surface 24. The angles theta_A through theta_D ($\theta_A$-$\theta_D$) may be the same or different according to the angular distribution of the particles 14A of the ion flux 14 required for treatment of the substrate 12.

Figure 4:
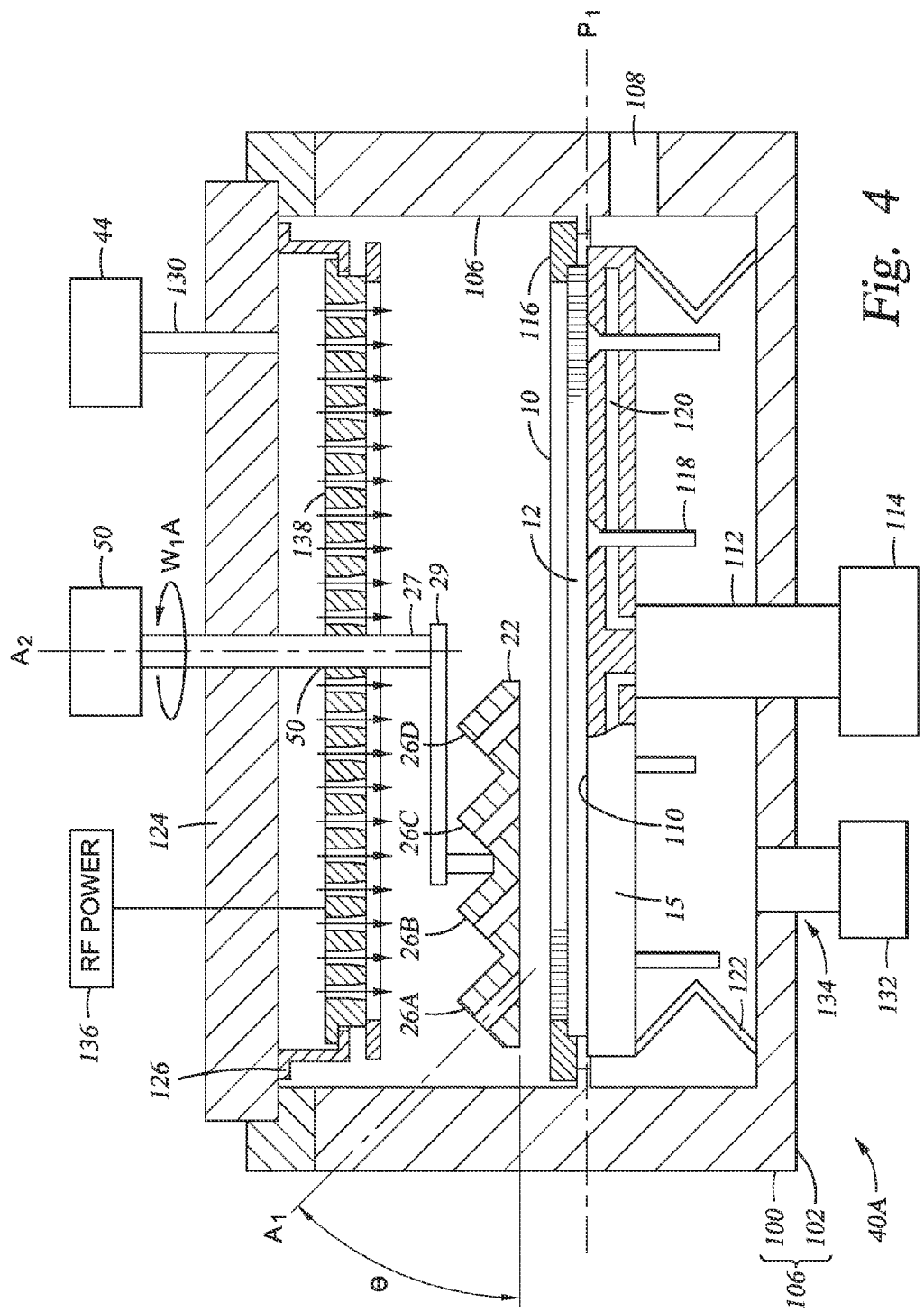
FIG. 4 is a schematic diagram of an exemplary process chamber including the distribution grid of FIG. 2A.

FIG. 4 is a schematic diagram of an exemplary process chamber 40A used for deposition including the distribution grid 22 of FIG. 2A therein. The process chamber 40A generally includes walls 100, a bottom 102, a gas distribution plate 138, and the distribution grid 22 which define the process volume 48. It is noted that the walls 100 and the bottom 102 may be included as part of a chamber enclosure body 106. The process volume 48 may be accessed through a sealable slit valve 108 formed through the walls 100 such that the substrate 12, may be transferred in and out of the process chamber 40A therethrough. The substrate support 15 includes the substrate receiving surface 110 for supporting the substrate 12 and a stem 112 coupled to a lift system 114 to raise and lower the substrate support 15. A shadow frame 116 may be placed over periphery of the substrate 12 during processing. Lift pins 118 are moveably disposed through the substrate support 15 to move the substrate 12 to and from the substrate receiving surface 110 to facilitate substrate transfer. The substrate support 15 may also include heating and/or cooling elements 120 to maintain the substrate support 15 and substrate 12 positioned thereon at a desired temperature. The substrate support 15 may also include grounding straps 122 at the periphery of the substrate support 15 to provide RF grounding of the substrate support 15.

The gas distribution plate 138 is coupled to (or supported by) a backing plate 124 at its periphery by the at least one suspension member 126. The shaft 27 (see FIGS. 2A and 2B) may be disposed through a center of the process chamber 40A and an actuator 50 used to drive the shaft 27 at the rotational speed omega1a ($\omega 1A$) to orbit the distribution grid 22 about the shaft 27. Also, the distribution grid 22 rotates about its own center (at axis of rotation R1) at the rotational speed omega1B ($\omega 1B$). In this manner, relative planetary movement between the distribution grid 22 and the substrate 12 is provided.

A gas source 44 is coupled to the backing plate 124 to provide gas through the backing plate 124 at an input port 130, and then to the distribution plate 138 and to the substrate 12 through the distribution grid 22 as the particles 14A of the ion flux 14 (FIG. 1). A vacuum pump 132 is coupled to the process chamber 40A to control pressure within the process volume 48 through an output port 134. An RF power source 136 (with or without a DC bias) may be coupled to the backing plate 124 and/or to the distribution plate 138 to provide RF power to the distribution plate 138 to generate an electric field between the distribution plate 138 and the distribution grid 22 so that the plasma 16 may be formed from the gas present between the distribution plate 138 and the distribution grid 22. Various RF frequencies may be used, such as a frequency between about 0.3 MHz and about 200 MHz. In one embodiment, the RF power source 136 may provide power to the distribution plate 138 at a frequency of 13.56 MHz. Alternatively, a DC bias may be provided to form the plasma 16. In other embodiments, the distribution grid 22 may be electrically negative with respect to the backing plate 124 and/or distribution plate 138 when the RF power source is applied to the distribution plate 138 to generate the electric field.

The distribution grid 22 may be coupled to the backing plate 124 via the shaft 27. The actuator 50 is configured to swing the distribution grid 22 around the center of the chamber and thus provide relative movement between the distribution grid 22 and the substrate 12. The relative motion enabled by the shaft 27 and the axis of rotation R1 of the distribution grid 22 as "planetary motion" is used to provide, over time or a number of rotations and orbits of the distribution grid 22 relative to the substrate 12, an isotropic ion, radical, or neutral flux to the substrate 12. Particles 14A of the ion flux 14 pass through the distribution grid 22 at the angle theta which will remain constant (within the intended range thereof), but the direction thereof with respect to the axis of the distribution grid 22 will swing through an entire 360 degree arc as the distribution grid 22 is scanned over the substrate 12. In this manner, isotropic or anisotropic deposition may be provided. Specifically, isotropic deposition may be provided as the particles 14A of the ion flux 14 directed by the distribution grid 22 are received by the substrate 12 at the direction $A_1$ normal to the focusing surface 26 (and angled at a non-orthogonal angle to the substrate 12). In contrast, anisotropic deposition may be provided by plasma formed at the portion of the substrate not overlaid by the distribution grid 22. The movement of the distribution grid 22 in a rotational and orbit movement may provide anisotropic deposition wherein a linear scanning movement of the distribution grid 22 may be used to achieve directed isotropic deposition on a subset of features of the substrate which are orientated to receive the particles 14A of the ion flux 14.

With continued reference to the embodiment depicted in FIG. 4, isotropic processing which are formed isotropically about arcs centered at axis A2 may be specifically provided by the distribution grid 22 by directing the particles 14A of the ion flux 14 to the front surface 10 of the substrate 12 at the angle theta (θ) which is normal to the focusing surface 26 (and angled non-orthogonally to the front surface 10 of the substrate 12). As the distribution grid 22 is swung through an entire 360 degree arc about an axis of rotation A2, the direction $A_1$ remains constant relative to the axis of rotation A2 as the distribution grid 22 is fixed relative to the swing arm 29 in the embodiment of FIG. 4. Accordingly, as the axis of rotation A2 remains stationary relative to the substrate 12 in the embodiment of FIG. 4, the particles 14A of the ion flux 14 are received by any one portion of the front surface 10 of the substrate 12 at the angle theta (θ) and from a single general direction providing isotropic processing of the front surface of the substrate 12. It is noted that anisotropic processing may alternatively be added to the embodiment depicted by FIG. 4 by incorporating further relative linear or rotational movement between the grid 22 and the substrate 12. This relative linear movement may be incorporated, for example, by linear movement of the substrate support 15 with first actuators (not shown) or linear movement of the shaft 27 with second actuators (not shown). In this manner, isotropic or anisotropic processing of the substrate 12 may be provided using the distribution grid 22.

In one embodiment, the heating and/or cooling elements 120 may be utilized to controllably maintain a desired temperature of the substrate support 15 and the substrate 12 thereon during processing. The process chamber 40A may be used to deposit silicon oxide ($SiO_x$) with silane ($SiH_4$) gas diluted in nitrous oxide ($N_2O$) by a PECVD process to generate a film widely used as a gate insulator, and as a buffer layer for heat dissipation and etch stop layers in TFT's and AMOLED's. The uniformity (i.e., thickness) of the oxide film has significant impact on the final device performance, such as mobility and drain current uniformity. A film non-uniformity of about five (5) percent, or less, across the substrate 12, as well as minimal edge exclusion, may be desirable. While progress has been made to reduce non-uniformity, there are regions of the substrate 12 where this non-uniformity is not achieved. For example, edges of the substrate 12, such as corner regions and sides of the substrate, may experience different deposition rates resulting in film thicknesses at these regions different than at other regions. The inclusion of the distribution grid 22 to the chamber 40A as discussed will may improve the ability to deposit thin films on sidewalls 18A, 18B, 19A, 19B.

Figure 5:
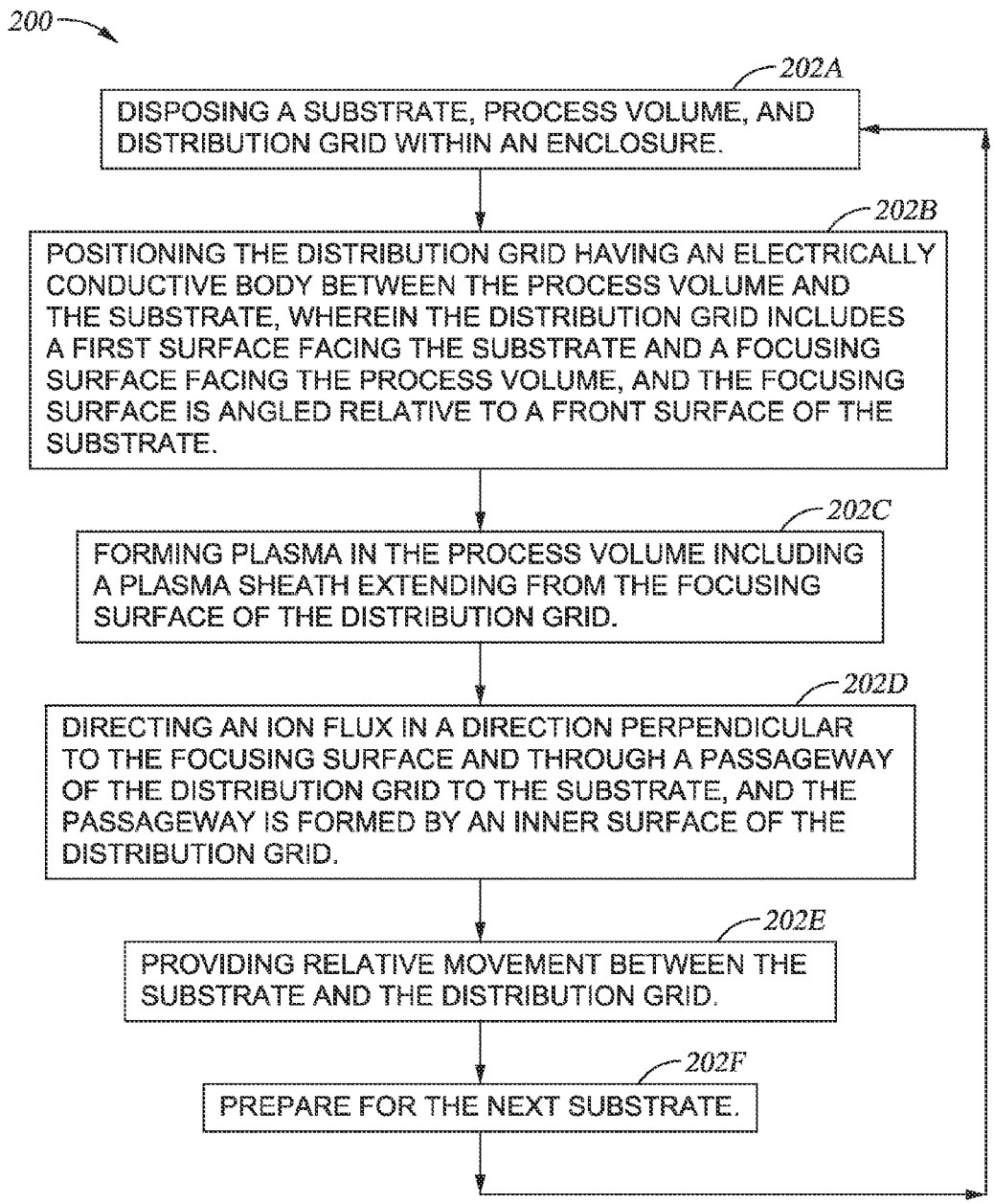
FIG. 5 is a flow chart diagram of an exemplary method for providing an angled ion flux for the substrate of FIG. 2A.
Figure 6A:
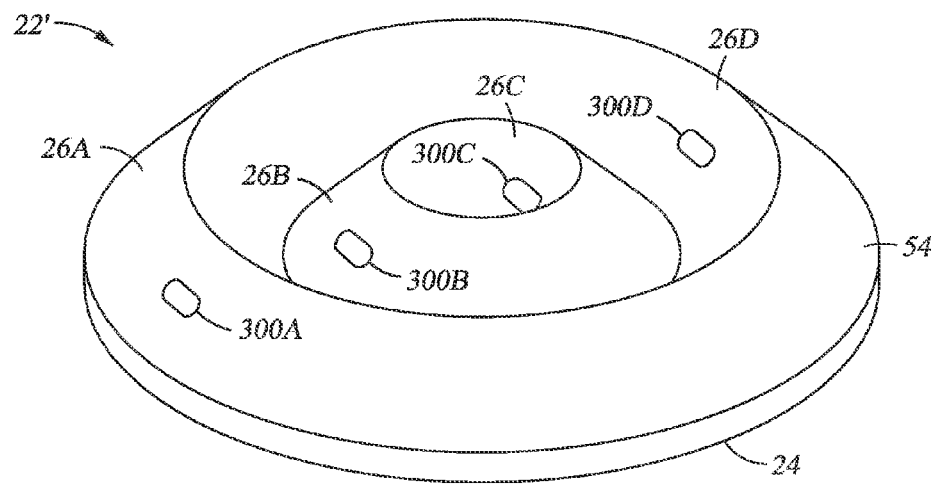
FIGS. 6A through 6D are a top perspective view, a sectional side view, a top view and a bottom view, respectively, of another embodiment of a distribution grid including passageways including cross-sections having slotted shapes.
Figure 6B:
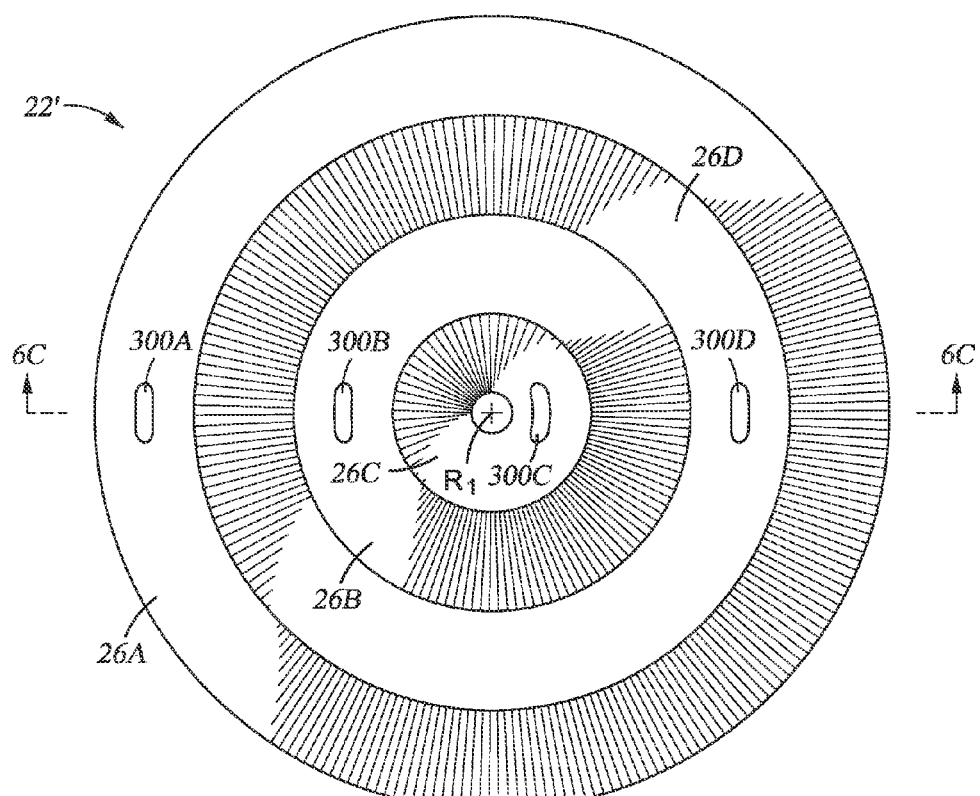
Figure 6C:
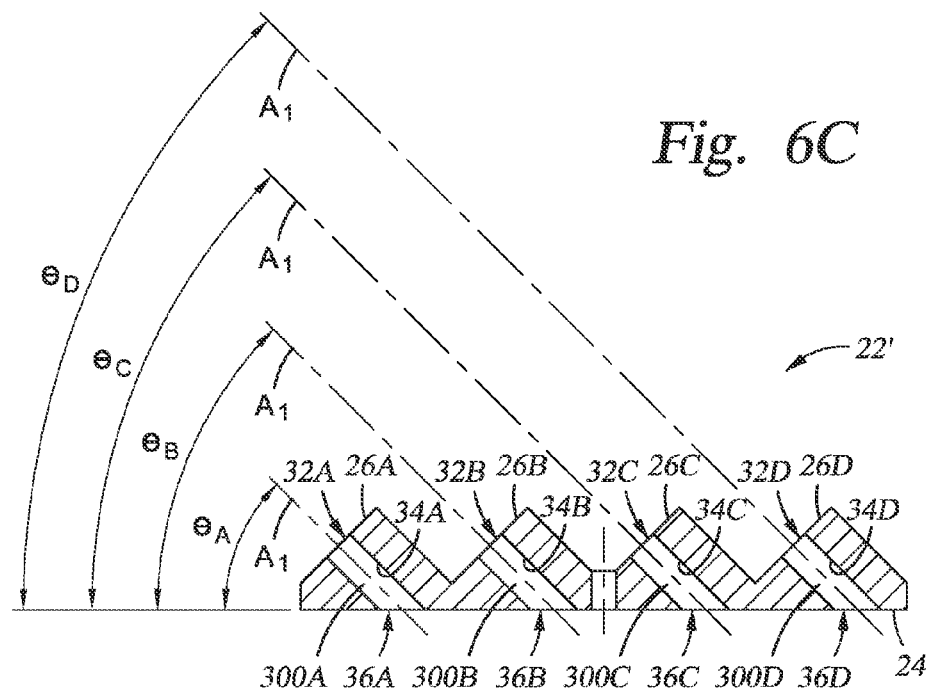
Figure 6D:
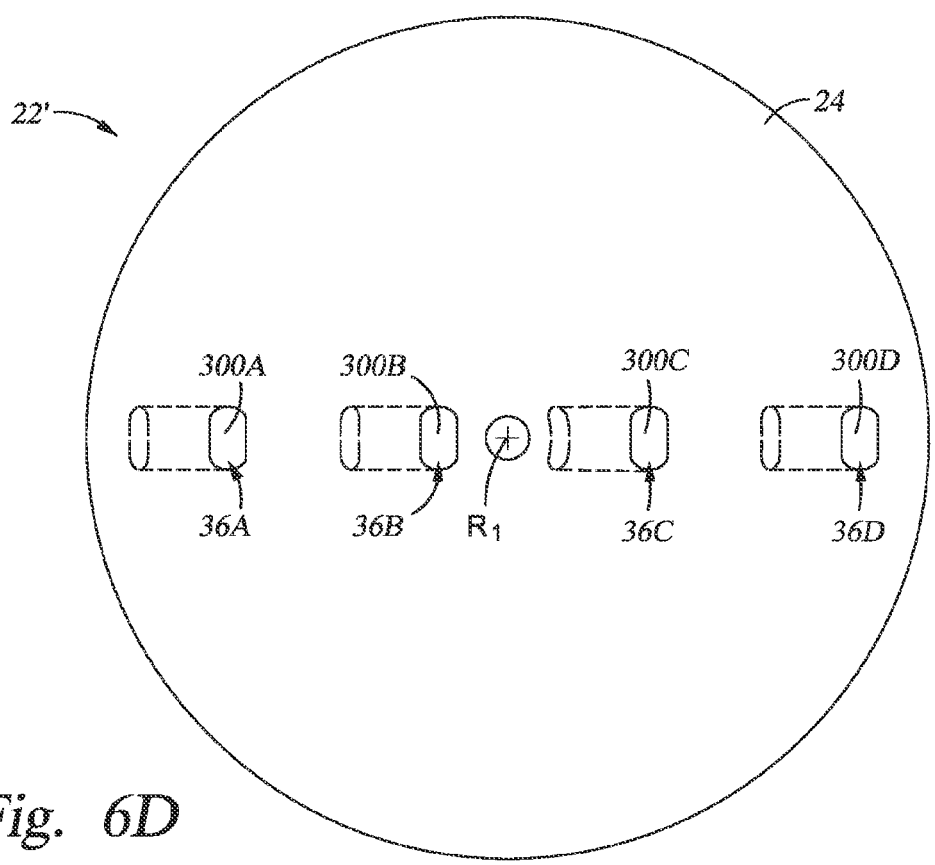

FIG. 5 is a flow chart diagram of an exemplary method 200 for providing the angularly directed particles 14A of the ion flux 14 for the substrate 12 of FIG. 2A. The method 200 will be discussed using terminology provided above and operations 202A through 202F of FIG. 5.

In this regard, the method 200 includes disposing the substrate 12, in a the process volume 48, having the distribution grid 22 (operation 202A of FIG. 5), and positioning the distribution grid 22 having the electrically-conductive body 54 between the process volume 48 and the substrate 12 (operation 202B of FIG. 5). The distribution grid 22 includes the first surface 24 facing the substrate 12 and the focusing surface 26 facing the process volume 48. The focusing surface 26 is angled, i.e., is not parallel to, the front surface 10 of the substrate 12. In this manner, the distribution grid 22 may be initially positioned for directing the particles 14A of the ion flux 14.

The method 200 includes forming the plasma 16 in the process volume 48 to form the plasma sheath 28 extending the thickness TH2 from the focusing surface 26 of the distribution grid 22 (operation 202C of FIG. 5). The method 200 includes directing the particles 14A of the ion flux 14 in a direction perpendicular to the focusing surface 26 and through the passageway 30A of the distribution grid 22 to the substrate 12 (operation 202D of FIG. 5). In this manner, the particles 14A of the ion flux 14 are received at the substrate 12 at angles other than perpendicular to the upper surface of the substrate to enable the flux to reach sidewalls of features thereon. The method 200 also includes providing relative movement between the substrate and the distribution grid (operation 202E of FIG. 5). In this manner, the substrate may be isotropically or anisotropically exposed with the particles 14A of the ion flux 14 at the sidewalls 18A, 18B, 19A, 19B of features thereon or therein. Once the substrate has been exposed to the particles 14A of the ion flux 14, the method 200 includes preparing for the next substrate 12 (operation 202F of FIG. 5)

Other embodiments of the distribution grid 22 are possible. FIGS. 6A through 6D are a top perspective view, a sectional side view, a top view and a bottom view, respectively, of another embodiment of a distribution grid 22' including passageways 30' as slots 300A-300D. The slots 300A-300D may enable a greater quantity of the particles 14A of the ion flux 14 to travel through the distribution grid 22' as the passageway is relatively larger compared to the passageways in circular form. Similarly to the distribution grid 22 of FIG. 2A, the distribution grid 22' includes the first surface 24, and the at least one focusing surface 26 opposite the first surface 24. The inner surface 34 of the distribution grid 22' connects the focusing surfaces 26A-26D with the first surface 24 and forms the passageways 30'A-30'D. In this manner, a greater rate of the particles 14A of the ion flux 14 may pass through the distribution grid 22'.

Figure 7A:
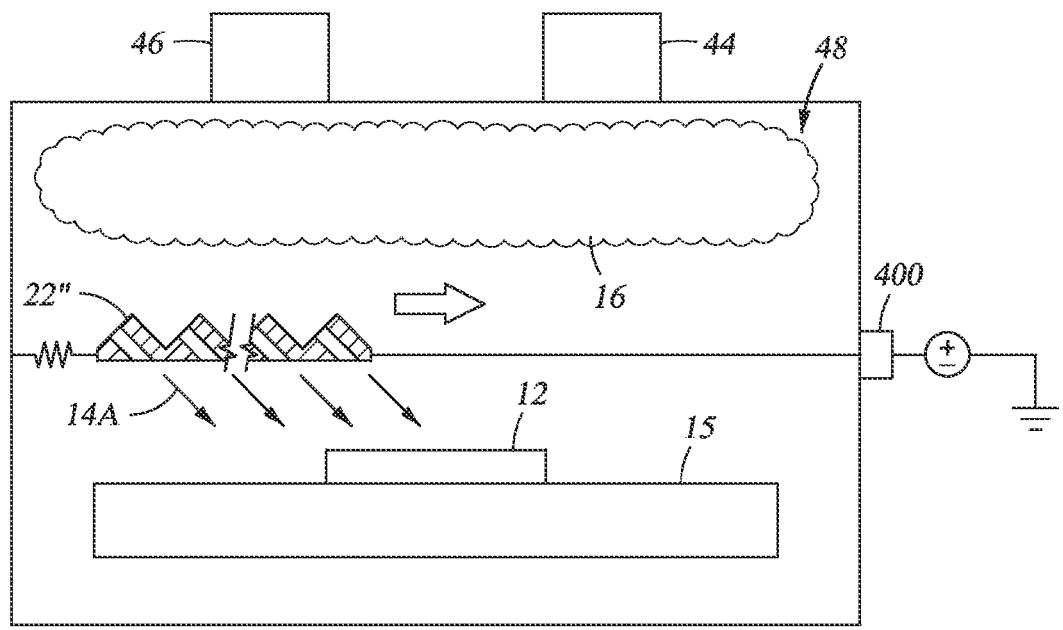
FIGS. 7A and 7B are side schematic views of another embodiment of a process chamber including relative movement between a distribution grid and a substrate wherein the relative movement is a linear scan.
Figure 7B:
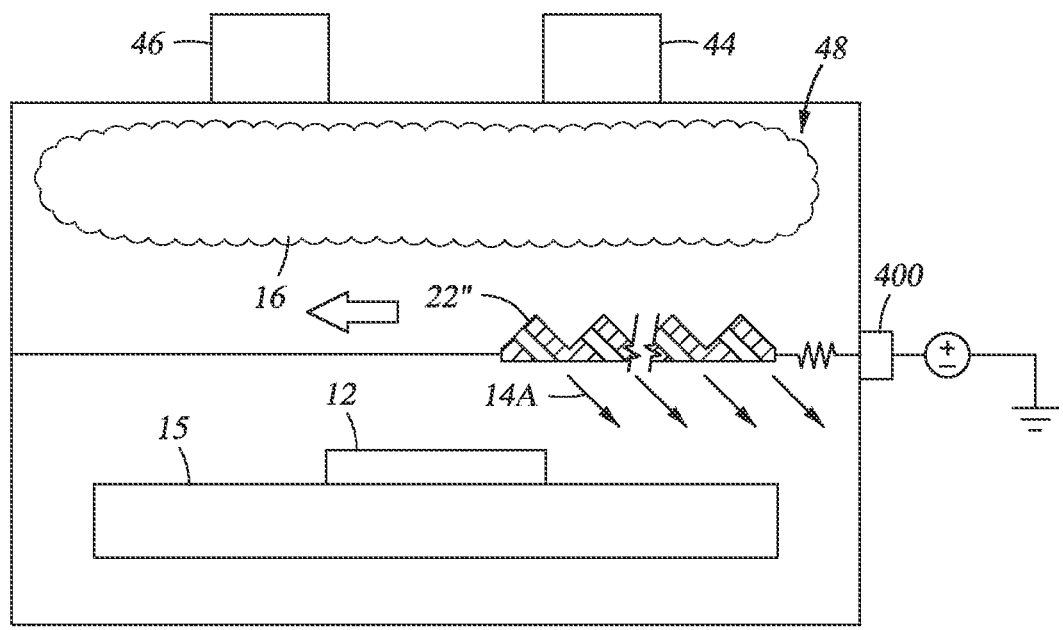
Figure 8A:
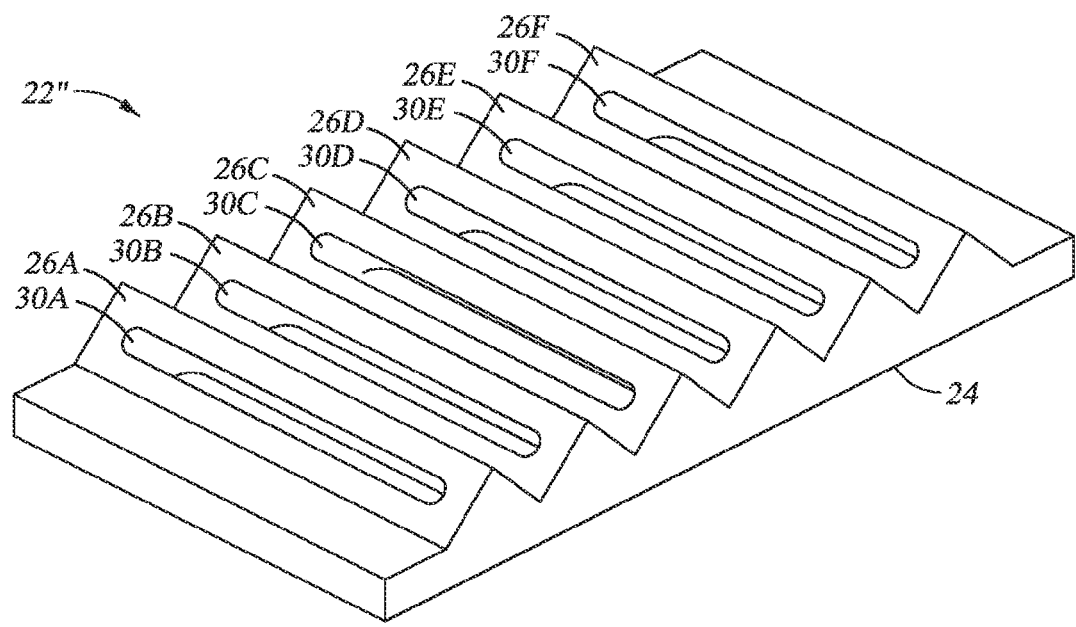
FIGS. 8A through 8D are a top perspective view, a sectional side view, a top view and a bottom view, respectively, of the distribution grid of FIGS. 7A and 7B.
Figure 8B:
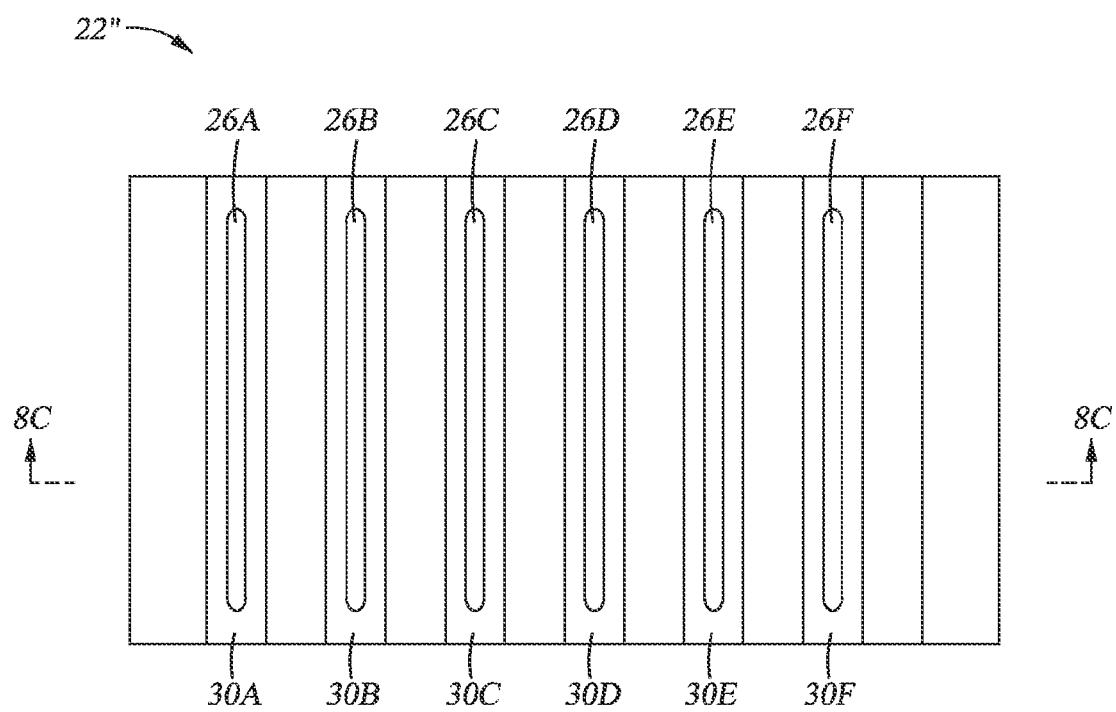
Figure 8C:
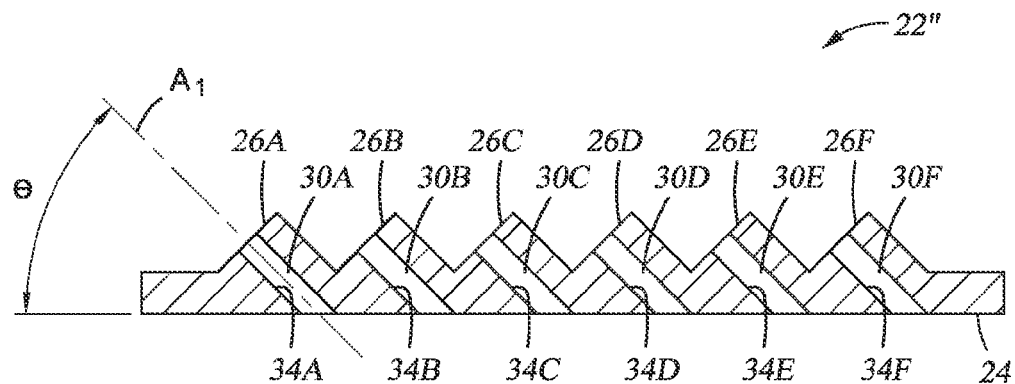
Figure 8D:
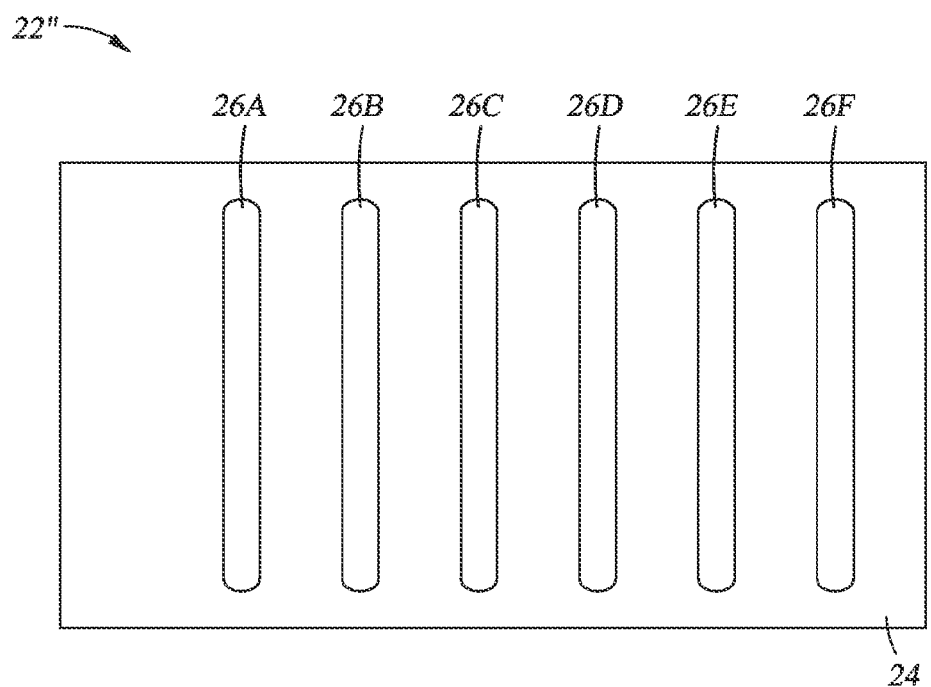

FIGS. 7A and 7B are side schematic views of another embodiment of a process chamber 40B including relative movement between a distribution grid 22" and the substrate 12 wherein the relative movement between the substrate 12 and the distribution grid 22" is a linear scanning movement. The process chamber 40B is similar to the process chamber 40 of FIG. 2A and only the differences thereof will be discussed for clarity and conciseness. The distribution grid 22" is disposed between the process volume 48 and the substrate 12. The distribution grid 22" translates back and forth across the substrate 12 as moved by an actuator 400. The actuator 400 may comprise, for example, an electric motor which is electrically isolated from the plasma 16. FIG. 7A depicts the distribution grid 22" translating and approaching the substrate 12 and FIG. 7B depicts the distribution grid 22" finishing the scan. In this manner, an isotropic exposure of the sidewalls 18A, 18B with the particles 14A of the ion flux 14 may be achieved. Additionally, by rotating the distribution grid 22 as it is scanned across the substrate 12, it is possible to provide an anisotropic flux of ions at the substrate surface.

FIGS. 8A through 8D are a top perspective view, a sectional side view, a top view and a bottom view, respectively, of the distribution grid 22" of FIGS. 7A and 7B. The distribution grid 22" may include the first surface 24 and the focusing surfaces 26A-26F. The normal of the focusing surfaces 26A-26F may be disposed at the angle theta (θ) relative to the first surface 24. The inner surfaces 34A-34F may connect the first surface 24 respectively to the focusing surfaces 26A-26F. In this manner, the ion flux 14 may be accelerated through the passageways 30A-30F formed by the inner surfaces 34A-34F through the distribution grid 22" and to the substrate 12. In this manner, the distribution grid 22" may also direct the particles 14A of the ion flux 14 to the substrate 12.

It is noted that the focusing surfaces 26A-26F may be tilted relative to each other, and the passageways 30A-30D may be disposed perpendicular to respective ones of the focusing surfaces 26A-26D. The associated angles theta_A through theta_D ($\Theta_A$-$\Theta_D$) are in a range from one (1) to forty-five (45) degrees. Disposing the passageways 30A-30D at different angular positions within this range may enable a wide variety of angles of different particles 14A of the ion fluxes 14 to be received at the substrate 12. In this manner a more uniform, exposure of the sidewalls 18A, 18B, 19A, 19B may be achieved. In addition, the aspect ratio of the passageways 30A-30D through the grid can also change directionally (as they will cull more stray trajectories the longer they are for the same width).

It is further noted that the etching process discussed above may include, for example, reactive ion etching wherein components of the particles 14A of the ion flux 14 chemically react with the front surface 10 of the substrate 12 when the particles 14A of the ion flux 14 are received at the front surface 10. The components of the particles 14A of the ion flux 14 may include, for example, fluorine and chlorine reactive species (for example, CF2, CF3, and CHF) originating from gases such as: carbon tetrafluoride (CF4), sulphur hexafluoride (SF6), chlorine trifluoride (ClF3), fluoroform (CHF3), nitrogen trifluoride (NF3), bromine trifluoride (BrF3). Iodine trifluoride (IF3), chlorine (Cl2) and/or carbon tetrachloride ($CCl_4$). In many cases there is also a background noble gas which supplies bombardment and sputter etching as well. The reactive species of the particles 14A of the ion flux 14 may be used to etch the front surface 10 containing silicon by forming volatile products (such as SiF4). The volatile products are then swept away by a gas flow from the front surface 10. In this manner, the front surface 10 of the substrate 12 may be etched using the particles 14A of the ion flux 14 directed by the distribution grid 22.

It is further noted that the distribution grid 22 is discussed above as being compatible with ion implantation processes. In this regard, ion implantation may be used in some cases to introduce dopant ions (i.e., boron, phosphorus, arsenic, etc.) into the front surface 10 of the substrate 12 to change the electrical conductivity characteristics of the sidewalls 18A, 18B (FIG. 1) at the front surface 10. When the dopant ions as part of the ion flux 14 are accelerated by the plasma sheath 28 (FIG. 1) orthogonal to the focusing surface 26 and through the passageway 30A, the dopant ions are received at the front surface 10 of the substrate 12 with substantial kinetic energy. As the dopant ions may also have masses comparable to atoms (i.e., silicon) included as part of the substrate 12 at the front surface 10, the atoms in the substrate 12 may in some cases be dislocated and the dopant ions incorporated to the substrate 12 at and/or within the front surface 10. As the distribution grid 22 directs the ion flux 14 at the non-parallel and non-normal angle theta (θ) relative to the front surface 10, the dopant ions can be directed at the sidewalls 18A, 18B. In this manner, the composition and conductivity characteristics of the sidewalls 18A, 18B may be controlled.

Figure 9A:
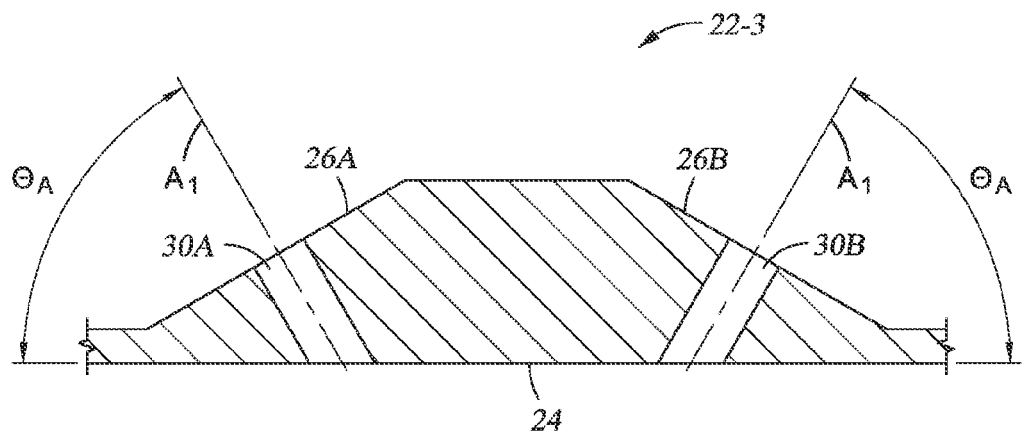
FIGS. 9A and 9B are a sectional view and a top perspective view of another example of a distribution grid.
Figure 9B:
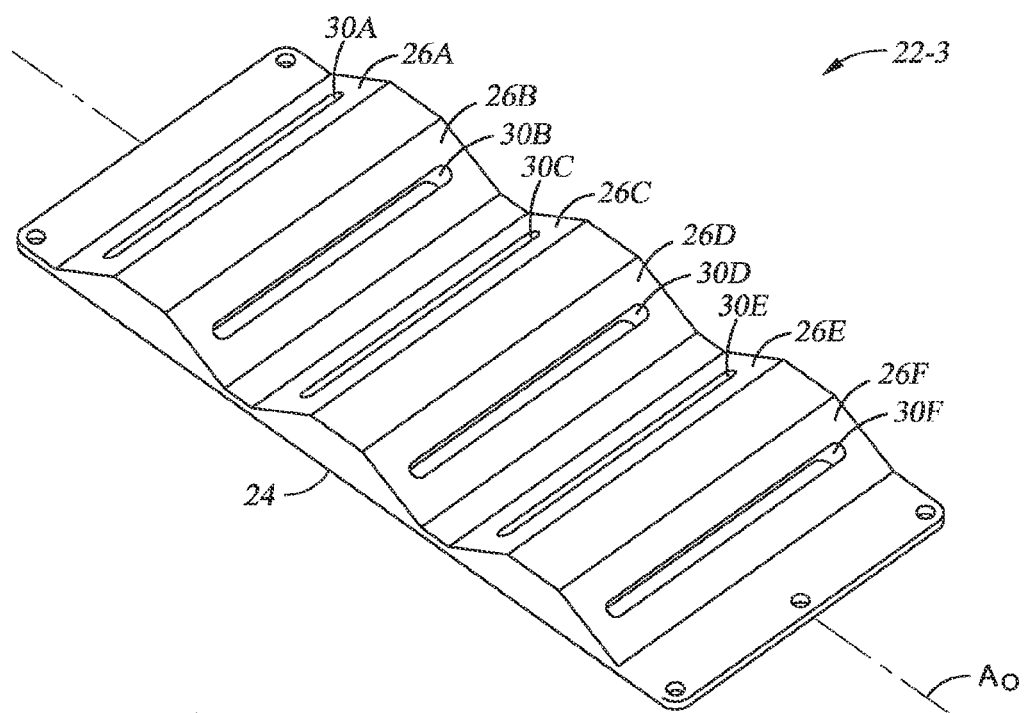

Other examples of a distribution grid are possible. FIGS. 9A and 9B are a sectional view and a top perspective view of a distribution grid 22-3, which is similar to the distribution grid 22", and so mainly the differences will be discussed in the interest of clarity and conciseness. The distribution grid 22-3 includes passageways 30A-30F which are angled relative to each other and have passageway center axes which may have directional components that are directed in opposite directions along the longitudinal axis A0 of the distribution grid 22-3. When the distribution grid 22-3 is moved in a linear scanning movement along its longitudinal axis A0 and above the substrate in the process chamber 40, then opposite surfaces of the substrate features 20A, 20B may be efficiently exposed in an anisotropic manner to the particles 14A of the ion flux 14. In this manner, exposure of the sidewalls 18A, 18B, 19A, 19B (see FIG. 1) may be efficiently achieved when the distribution grid 22-3 is operated in similar manner as is shown by distribution grid 22" in FIGS. 7A-7B.

Figure 10A:
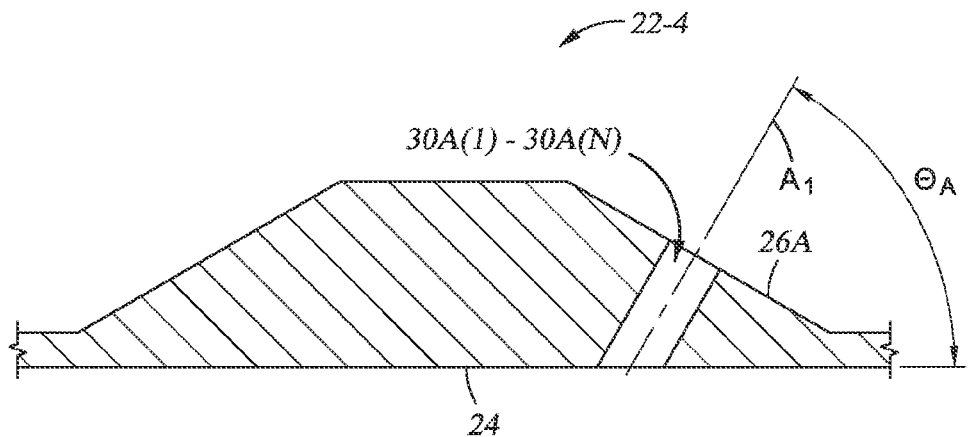
FIGS. 10A and 10B are a sectional view and a top perspective view of another example of a distribution grid.
Figure 10B:
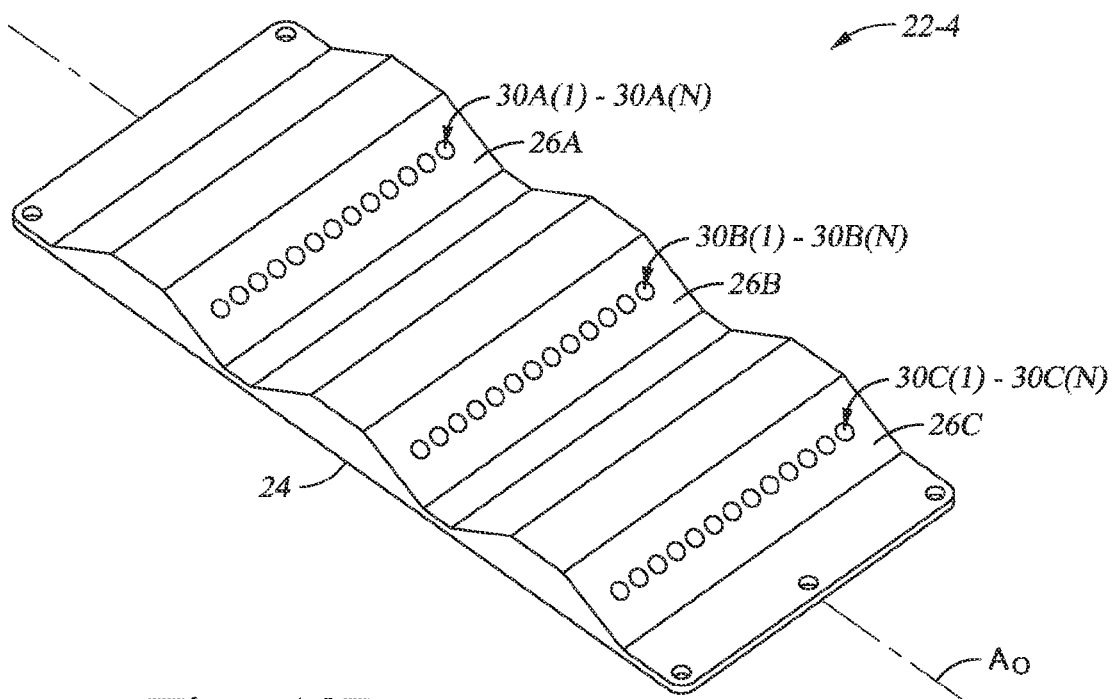

In another example, FIGS. 10A and 10B are a sectional view and a top perspective view of a distribution grid 22-4, which is similar to the distribution grid 22", and so mainly the differences will be discussed in the interest of clarity and conciseness. The distribution grid 22-4 includes passageways 30A(1)-30A(N), 30B(1)-30B(N), 30C(1)-30C(N) having circular or oval cross-sections instead of the passageways 30A-30F of the distribution grid 22" having slot-shapes. The circular or oval cross-sections provide greater directional filtering of the ions and reduce angular variance of the ions that travel through the passageways 30A(1)-30C(N) of the distribution grid 22-4 as compared to ion trajectories which may pass through elongated slots. In this manner, a more uniform, anisotropic, exposure of the sidewalls 18A, 18B, 19A, 19B may be achieved.

Figure 11A:
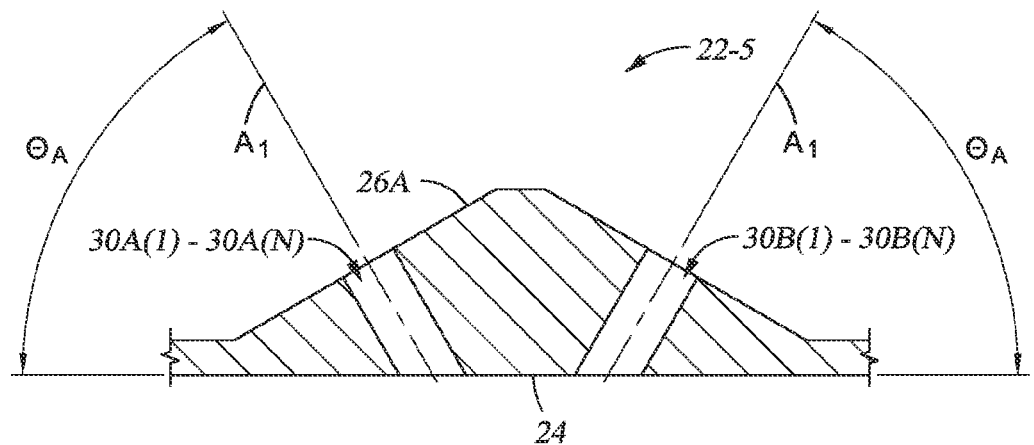
FIGS. 11A and 11B are a sectional view and a top perspective view of another example of a distribution grid.
Figure 11B:
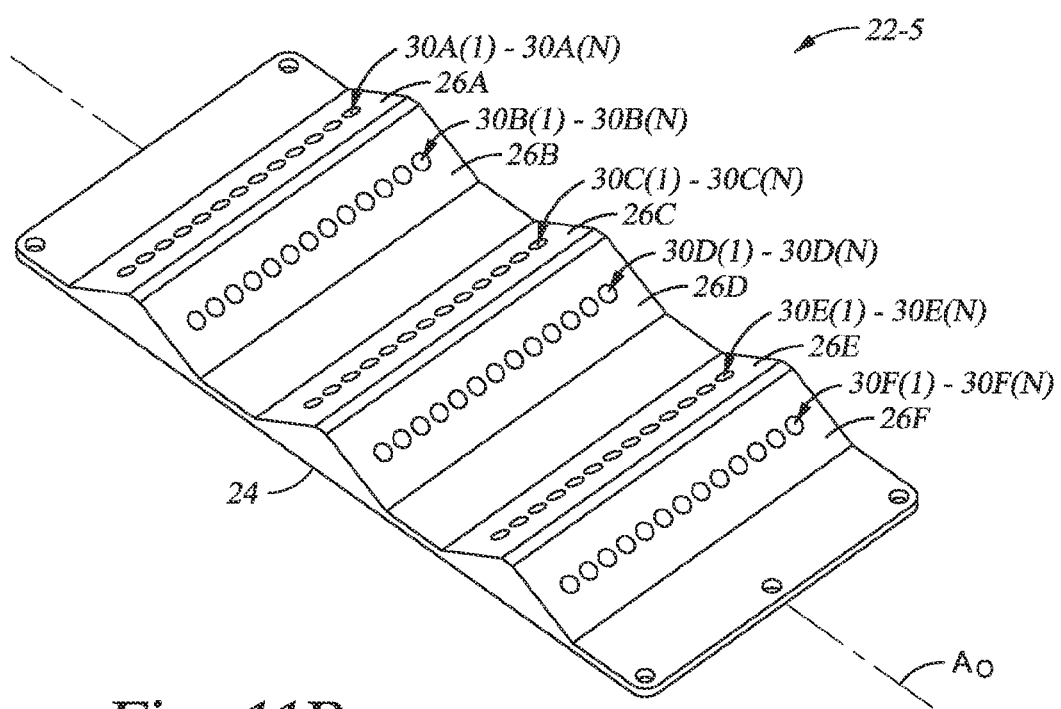

In another example, FIGS. 11A and 11B are a sectional view and a top perspective view of a distribution grid 22-5, which is similar to the distribution grid 22-4, and so mainly the differences will be discussed in the interest of clarity and conciseness. The distribution grid 22-5 includes groupings of passageways 30A(1)-30F(N) which are angled relative to each other and have passageway center axes which have directional components that are directed in opposite directions along the longitudinal axis A0 of the distribution grid 22-5. In this manner, anisoptropic exposure of the sidewalls 18A, 18B, 19A, 19B (see FIG. 1) may be efficiently achieved when the distribution grid 22-3 is operated in similar manner as is shown by distribution grid 22" in FIGS. 7A-7B.

Many modifications and other embodiments not set forth herein will come to mind to one skilled in the art to which the embodiments pertain having the benefit of the teachings presented in the foregoing descriptions and the associated drawings. Therefore, it is to be understood that the description and claims are not to be limited to the specific embodiments disclosed and that modifications and other embodiments are intended to be included within the scope of the appended claims. It is intended that the embodiments cover the modifications and variations of the embodiments provided they come within the scope of the appended claims and their equivalents. Although specific terms are employed herein, they are used in a generic and descriptive sense only and not for purposes of limitation.

While the foregoing is directed to embodiments of the present invention, other and further embodiments of the invention may be devised without departing from the basic scope thereof, and the scope thereof is determined by the claims that follow.

What is claimed is:

1. A process chamber, comprising:
   an enclosure having a process volume for forming plasma therein;
   a substrate support having a substrate receiving surface, the substrate support disposed within the enclosure for positioning a front surface of a substrate with respect to the process volume; and
   a distribution grid disposed between the process volume and the substrate support, the distribution grid including a first surface facing the substrate support and a focusing surface opposite the first surface, the focusing surface angled relative to the substrate receiving surface of the substrate support, wherein the distribution grid also includes an inner surface connecting the focusing surface with the first surface, the inner surface forming a passageway through the focusing surface and the first surface, the passageway having a center axis which is angled with respect to the substrate receiving surface of the substrate support, and wherein the distribution grid is rotatable about an axis that is offset from a center of the distribution grid.

2. The process chamber of claim 1, further comprising a bias source or an electrical ground connected to the distribution grid.

3. The process chamber of claim 1, wherein the distribution grid is electrically conducting.

4. The process chamber of claim 1, wherein the first surface is offset from the front surface of the substrate by an offset distance, and the offset distance is in a range from two (2) to twelve (12) millimeters.

5. The process chamber of claim 1, wherein an angle between a normal of the focusing surface and a normal of a geometric plane of the substrate front surface is in a range from one (1) to forty-five (45) degrees.

6. The process chamber of claim 1, wherein the distribution grid comprises at least one of: silicon carbide, doped silicon and nanocrystalline diamond.

7. The process chamber of claim 1, wherein the process chamber is configured to move the distribution grid in a planetary motion above the substrate support.

8. The process chamber of claim 1, wherein the distribution grid includes a plurality of focusing surfaces, each focusing surface angled relative to the substrate receiving surface of the substrate support, wherein a passageway connects each focusing surface of the plurality of focusing surfaces to the first surface, each passageway extending through the first surface and through one of the focusing surfaces and each passageway angled with respect to the substrate receiving surface.

9. The process chamber of claim 1, wherein the first surface is parallel to the substrate support.

10. The process chamber of claim 1, further comprising a shaft and an arm, the arm connecting the shaft to the distribution grid, wherein the shaft is rotatable about a central axis that is offset from the center of the distribution grid.

11. The process chamber of claim 10, wherein the process chamber is further configured to rotate the distribution grid about a central axis of the distribution grid.

12. The process chamber of claim 10, wherein the arm is configured to rotate the distribution grid around a path, the path including a first position and a second position, wherein a normal from the substrate receiving surface of the substrate support intersects the distribution grid at the first position and does not intersect the distribution grid at the second position.

13. A method, comprising:
   disposing a substrate, process volume, and distribution grid within an enclosure;
   positioning the distribution grid having an electrically conductive body between the process volume and the substrate, wherein the distribution grid includes a first surface facing the substrate and an opposing focusing surface facing the process volume, wherein the focusing surface is angled relative to a front surface of the substrate;
   forming a plasma in the process volume, the plasma including a plasma sheath extending a thickness from the focusing surface of the distribution grid;
   directing an ion flux in a direction perpendicular to the focusing surface such that the ion flux is accelerated across the plasma sheath and particles of the ion flux enter and pass through passageways of the distribution grid from the focusing surface to the first surface in an angled direction towards the substrate; and
   rotating the distribution grid about an axis that is offset from a center of the distribution grid.

14. The method of claim 13, wherein directing the ion flux comprises applying an electric ground to the distribution grid.

15. The method of claim 13, wherein the thickness of the plasma sheath extending from the focusing surface is greater than a width of the passageway.

16. The method of claim 13, further comprising moving the distribution grid in a planetary motion above the substrate.

17. The method of claim 13, further comprising rotating the distribution grid around a path above the substrate from a first position to a second position, wherein a normal line from a front surface of the substrate intersects the distribution grid in the first position and does not intersect the distribution grid in the second position.

18. A distribution grid assembly for a process chamber, comprising:
   a distribution grid comprising an electrically conductive body having a center, the electrically conductive body including a first surface and a plurality of focusing surfaces opposite the first surface, wherein
      the first surface is configured to face a front surface of a substrate;
      each focusing surface is angled relative to the first surface;
      each focusing surface is located at a different distance from the center of the electrically conductive body; and
      an inner surface connects each focusing surface with the first surface, wherein each inner surface forms a passageway through the first surface and through one of the focusing surfaces, each passageway having a center axis disposed at an angle other than perpendicular to the first surface; and
   a shaft coupled to the distribution grid, wherein the shaft is rotatable to rotate the distribution grid about a central axis that is offset from a center of the distribution grid.

19. The distribution grid of claim 18, wherein each focusing surface surrounds the center of the electrically conducting body.

20. The distribution grid of claim 18, wherein the plurality of focusing surfaces includes four or more focusing surfaces.

\* \* \* \* \*